United States Patent
Nishida et al.

(10) Patent No.: US 9,514,909 B2
(45) Date of Patent: Dec. 6, 2016

(54) ION GENERATION APPARATUS AND ELECTRIC EQUIPMENT USING THE SAME

(75) Inventors: Hiromu Nishida, Osaka (JP); Koichi Izu, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 504 days.

(21) Appl. No.: 14/116,242

(22) PCT Filed: Apr. 18, 2012

(86) PCT No.: PCT/JP2012/060416
§ 371 (c)(1),
(2), (4) Date: Nov. 7, 2013

(87) PCT Pub. No.: WO2012/157391
PCT Pub. Date: Nov. 22, 2012

(65) Prior Publication Data
US 2014/0103793 A1    Apr. 17, 2014

(30) Foreign Application Priority Data

May 18, 2011 (JP) .................................. 2011-111352
Aug. 26, 2011 (JP) .................................. 2011-184906
Jan. 11, 2012 (JP) .................................. 2012-003034

(51) Int. Cl.
| H01J 27/02 | (2006.01) |
| H01J 37/08 | (2006.01) |
| H01T 19/04 | (2006.01) |
| H01T 23/00 | (2006.01) |

(52) U.S. Cl.
CPC ............... *H01J 27/02* (2013.01); *H01J 37/08* (2013.01); *H01T 19/04* (2013.01); *H01T 23/00* (2013.01)

(58) Field of Classification Search
CPC ......... H01J 27/02; H01J 37/08; H01T 19/04; H01T 23/00
USPC ............................................ 361/230
See application file for complete search history.

(56) References Cited

U.S. PATENT DOCUMENTS

| 2009/0283692 A1* | 11/2009 | Sekoguchi | H01T 23/00 250/423 F |
| 2011/0085276 A1 | 4/2011 | Nishida | |

FOREIGN PATENT DOCUMENTS

| JP | 2005-142131 A | 6/2005 |
| JP | 2006-284164 A | 10/2006 |
| JP | 2009-283305 A | 12/2009 |
| JP | 2010-44917 A | 2/2010 |

* cited by examiner

*Primary Examiner* — Thienvu Tran
*Assistant Examiner* — Kevin J Comber
(74) *Attorney, Agent, or Firm* — Birch, Stewart, Kolasch & Birch, LLP

(57) ABSTRACT

In this ion generation apparatus, tip end portions of needle electrodes are aligned in an X direction with being oriented in a Z direction, and protrude from a casing. A protective cover covers the tip end portions of the needle electrodes. The protective cover is provided with holes opened to allow tip ends of the needle electrodes to be seen from the Z direction, and an opening opened to allow the needle electrodes to be seen from a Y direction. Therefore, ions generated at the tip end portions of the needle electrodes can be emitted efficiently out of the casing. Further, a user can be prevented from touching the tip end portion of the needle electrode and injuring his or her finger or the like.

17 Claims, 23 Drawing Sheets

FIG.1
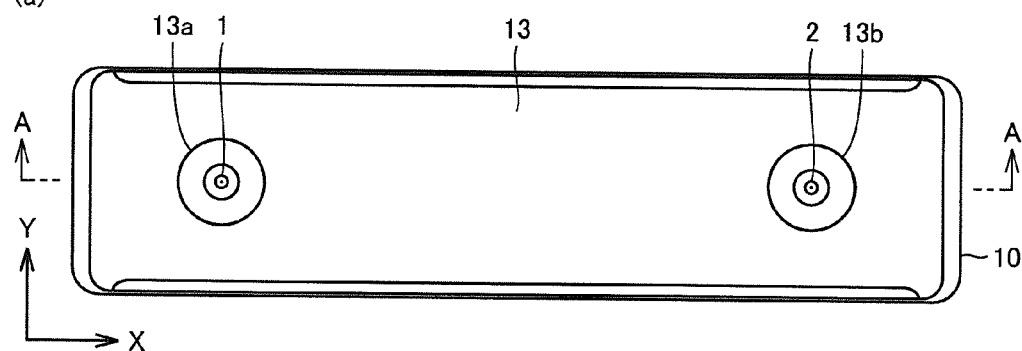
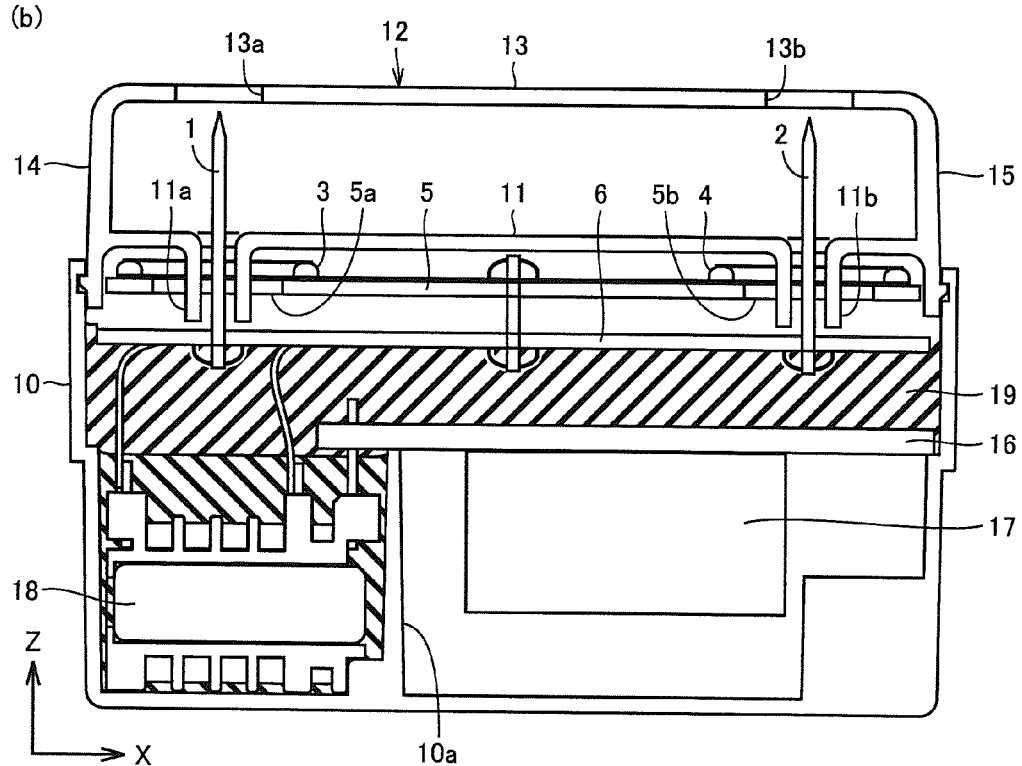

FIG.13

| OPENING | NOT OPENED | OPENED | NOT OPENED | OPENED |
|---|---|---|---|---|
| ION GENERATION APPARATUS | | | | |
| AMOUNT OF IONS | ABOUT 6.5 MILLION/cm$^3$ | ABOUT 9 MILLION/cm$^3$ | ABOUT 8 MILLION/cm$^3$ | ABOUT 10 MILLION/cm$^3$ |

ION GENERATION APPARATUS AND ELECTRIC EQUIPMENT USING THE SAME

TECHNICAL FIELD

The present invention relates to an ion generation apparatus and electric equipment using the same, and particularly to an ion generation apparatus generating ions including a plurality of needle electrodes, and electric equipment using the same.

BACKGROUND ART

Conventionally, an ion generation apparatus includes a substrate and two sets of induction electrodes and needle electrodes. Each induction electrode is annularly formed and mounted on a surface of the substrate. Each needle electrode has a base end portion provided in the substrate, and a tip end portion arranged at a central portion of the corresponding induction electrode. When a positive high voltage is applied between the needle electrode and the induction electrode of one set, corona discharge occurs at the tip end portion of the needle electrode, generating positive ions. When a negative high voltage is applied between the needle electrode and the induction electrode of the other set, corona discharge occurs at the tip end portion of the needle electrode, generating negative ions. The generated positive ions and negative ions are delivered into a room by an air blower, and surround and decompose molds and viruses floating in the air (see, for example, Japanese Patent Laying-Open No. 2010-044917 (PTD 1)).

CITATION LIST

Patent Document

PTD 1: Japanese Patent Laying-Open No. 2010-044917

SUMMARY OF INVENTION

Technical Problem

When the substrate having two sets of induction electrodes and needle electrodes mounted thereon and a power supply applying a positive high voltage and a negative high voltage are accommodated in one casing to produce an ion generation apparatus, it is necessary to emit positive ions and negative ions generated at the tip end portions of the two needle electrodes efficiently out of the casing. It is also necessary to prevent a user from touching the tip end portion of the needle electrode or the like and injuring his or her finger or the like.

Therefore, a main object of the present invention is to provide an ion generation apparatus which is safe and can generate ions efficiently, and electric equipment using the same.

Solution to Problem

An ion generation apparatus in accordance with the present invention is an ion generation apparatus generating ions including a plurality of needle electrodes, including a substrate having the plurality of needle electrodes mounted thereon, and a casing accommodating the substrate. The plurality of needle electrodes have tip end portions aligned in an X direction with being oriented in a Z direction, and protruding from the casing. The ion generation apparatus further includes a protective cover covering the tip end portions of the plurality of needle electrodes. The protective cover is provided with a plurality of first holes opened to allow tip ends of the plurality of needle electrodes to be seen from the Z direction, respectively, and a first opening opened to allow the plurality of needle electrodes to be seen from a Y direction.

Therefore, since the tip end portions of the plurality of needle electrodes protrude from the casing, ions generated at the tip end portions of the needle electrodes can be emitted efficiently out of the casing. Further, since the protective cover covering the tip end portions of the plurality of needle electrodes is provided, the protective cover can prevent a user from touching the tip end portion of the needle electrode and injuring his or her finger or the like.

Further, since the plurality of first holes are opened in the protective cover to allow the tip ends of the plurality of needle electrodes to be seen from the Z direction, respectively, the plurality of first holes can prevent an electric field generated on the periphery of the tip end portion of each needle electrode from being disturbed by the protective cover and causing a reduction in the amount of generated ions. Furthermore, since the first opening is provided in the protective cover to allow the plurality of needle electrodes to be seen from the Y direction, ions can be delivered efficiently by blowing the air in the Y direction.

Preferably, the ion generation apparatus further includes a lid member closing the casing so as to cover the substrate, and the lid member is provided with a second hole opened at a position corresponding to each needle electrode. The protective cover includes a top plate provided to face the lid member and having the plurality of first holes opened therein, and support members provided between the top plate and the lid member and having the first opening opened therein. The tip end portion of each needle electrode penetrates through the corresponding second hole and is arranged between the lid member and the top plate.

Preferably, the support members support the top plate on both sides of the plurality of needle electrodes as viewed from the Y direction. In this case, the user can be more effectively prevented from touching the tip end portion of the needle electrode and injuring his or her finger or the like.

Preferably, as viewed from the X direction, the support members have a width smaller than that of the top plate.

Preferably, as viewed from the X direction, the support members support a central portion of the top plate.

Preferably, as viewed from the X direction, the support members support one end portion of the top plate.

Preferably, the ion generation apparatus further includes a rib provided between each two adjacent needle electrodes and connected between the top plate and the lid member. In this case, a space between the top plate and the lid member can be partitioned for each needle electrode, and an electric field generated from each needle electrode is less likely to be affected by another needle electrode adjacent thereto. Further, the strength of the protective cover can be maintained. Furthermore, recombination of positive ions and negative ions and resultant disappearance thereof can be suppressed.

Preferably, the rib is formed in a shape of a flat plate, and provided parallel to a YZ plane.

Preferably, the rib is formed in a shape of a column, and extends in the Z direction.

Preferably, the protective cover is further provided with a second opening opened to allow at least one of the plurality of needle electrodes to be seen from the X direction.

Preferably, the ion generation apparatus further includes a lid member closing the casing so as to cover the substrate, and the lid member is provided with a second hole opened at a position corresponding to each needle electrode. The protective cover includes a top plate provided to face the lid member and having the plurality of first holes opened therein, and support members provided between the top plate and the lid member and having the first opening and the second opening opened therein. The tip end portion of each needle electrode penetrates through the corresponding second hole and is arranged between the lid member and the top plate.

Preferably, the support members support the top plate on both sides of the plurality of needle electrodes as viewed from the Y direction, and support the top plate on both sides of the plurality of needle electrodes as viewed from the X direction In this case, the user can be more effectively prevented from touching the tip end portion of the needle electrode and injuring his or her finger or the like.

Preferably, each two adjacent needle electrodes generate ions having polarities different from each other.

Further, electric equipment in accordance with the present invention is electric equipment, including the ion generation apparatus described above, and a duct blowing air in a predetermined direction. The plurality of needle electrodes of the ion generation apparatus are provided inside the duct.

Preferably, the predetermined direction intersects with the X direction.

Preferably, the predetermined direction obliquely intersects with the X direction.

Preferably, the predetermined direction is identical to the X direction.

Advantageous Effects of Invention

As described above, according to the present invention, ions can be generated efficiently, and the user can be prevented from being injured.

BRIEF DESCRIPTION OF DRAWINGS

FIG. 1 is a cross sectional view showing a configuration of an ion generation apparatus in accordance with Embodiment 1 of the present invention.

FIG. 13 is a view showing the effect of the ion generation apparatus shown in FIG. 9.

DESCRIPTION OF EMBODIMENTS

[Embodiment 1]

Figure 2:
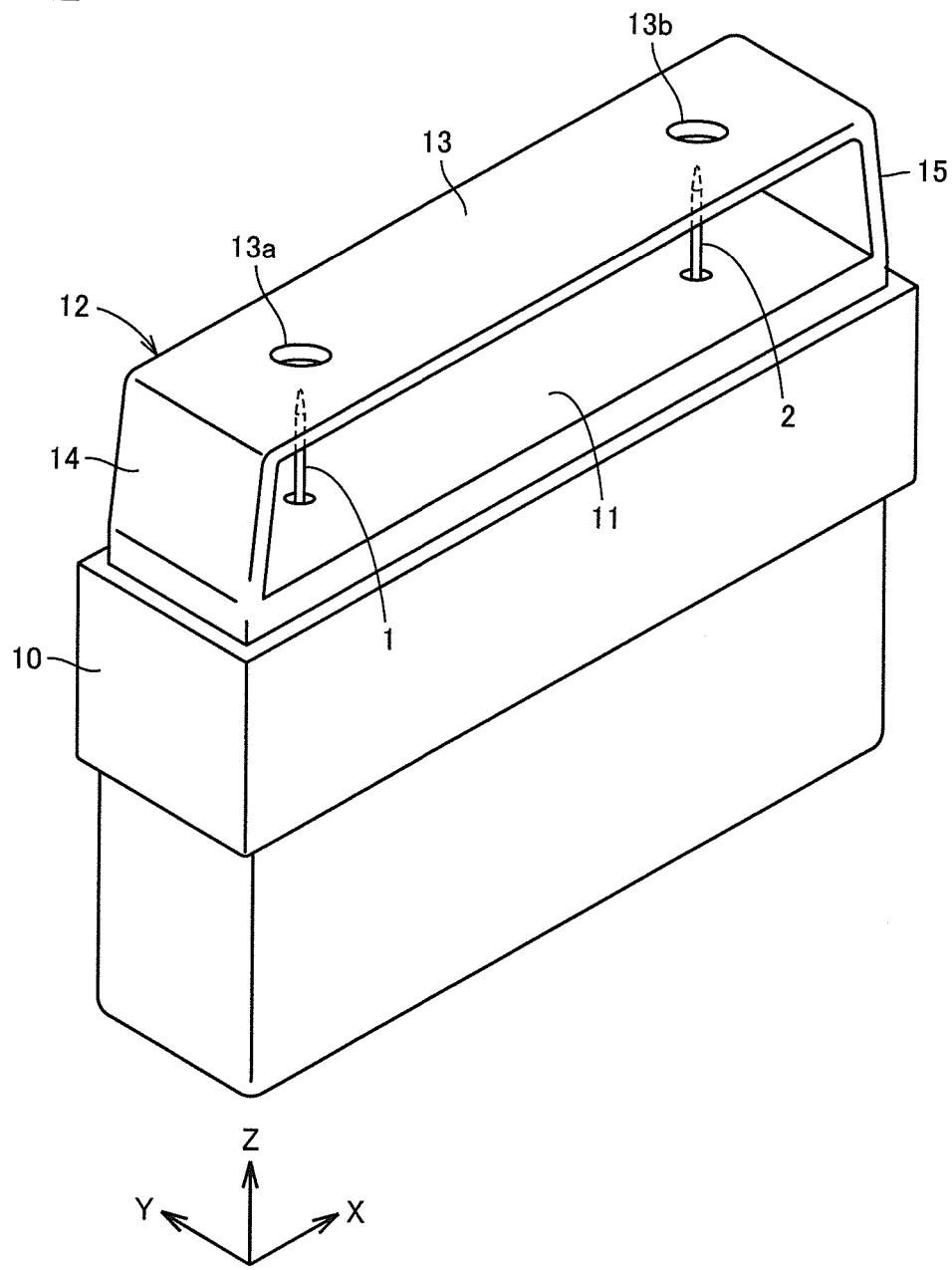
FIG. 2 is a perspective view of the ion generation apparatus shown in FIG. 1.

FIG. 1(a) is a top view of an ion generation apparatus in accordance with Embodiment 1 of the present invention, and FIG. 1(b) is a cross sectional view taken along a line A-A in FIG. 1(a). FIG. 2 is a perspective view of the ion generation apparatus, and FIG. 3 is a perspective view of the ion generation apparatus shown in FIG. 2 with a lid member 11 and a protective cover 12 being removed therefrom.

Figure 3:
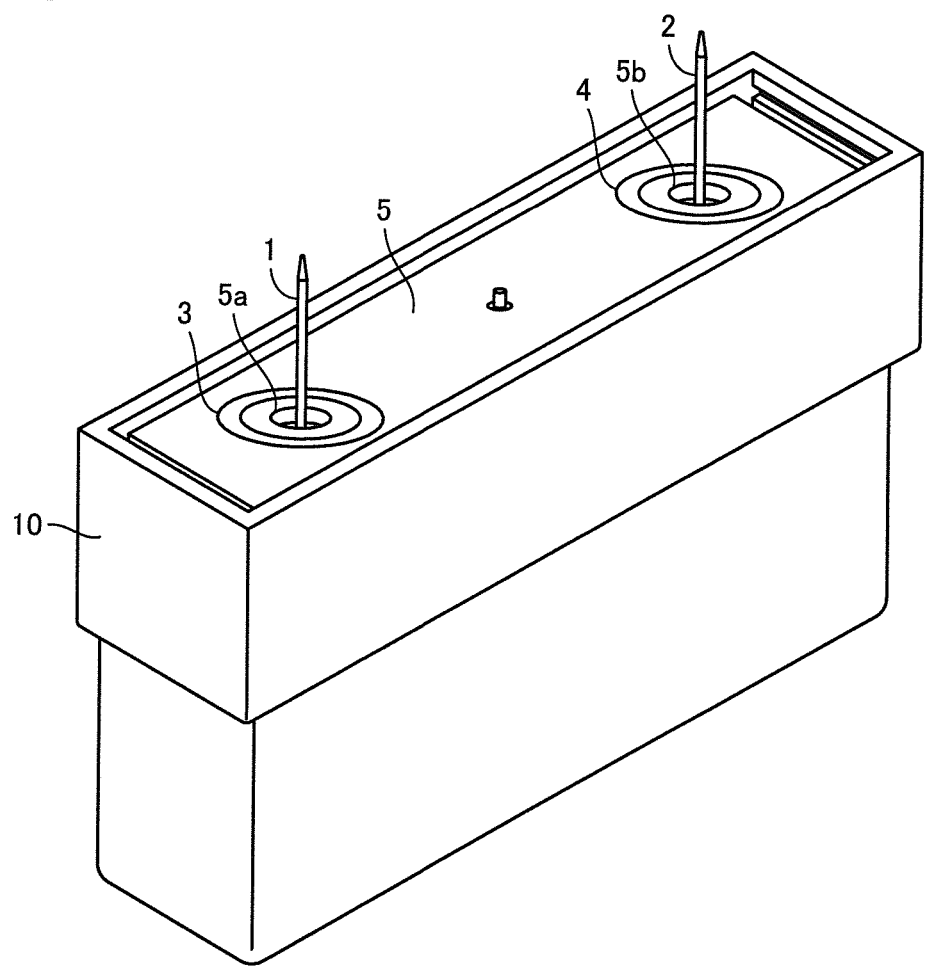
FIG. 3 is a perspective view of the ion generation apparatus shown in FIG. 2 with a lid member and a protective cover being removed therefrom.

In FIGS. 1 to 3, the ion generation apparatus includes a needle electrode 1 for generating positive ions, a needle electrode 2 for generating negative ions, an annular induction electrode 3 for forming an electric field between itself and needle electrode 1, an annular induction electrode 4 for forming an electric field between itself and needle electrode 2, and two rectangular printed substrates 5, 6.

Printed substrates 5, 6 are arranged parallel to each other in a vertical direction in FIG. 1(b), with a predetermined interval therebetween. Induction electrode 3 is formed on a surface of printed substrate 5 at one end portion in a longitudinal direction, using a wiring layer of printed substrate 5. A hole 5a penetrating through printed substrate 5 is opened on the inside of induction electrode 3. Further, induction electrode 4 is formed on the surface of printed substrate 5 at the other end portion in the longitudinal direction, using a wiring layer of printed substrate 5. A hole 5b penetrating through printed substrate 5 is opened on the inside of induction electrode 4.

Each of needle electrodes 1, 2 is provided perpendicular to printed substrates 5, 6. Specifically, needle electrode 1 has a base end portion inserted in a hole in printed substrate 6, and a tip end portion penetrating through the center of hole 5a in printed substrate 5. Further, needle electrode 2 has a base end portion inserted in a hole in printed substrate 6, and a tip end portion penetrating through the center of hole 5b in printed substrate 5. The base end portion of each of needle electrodes 1, 2 is fixed to printed substrate 5b by soldering. The tip end portion of each of needle electrodes 1, 2 is sharply pointed.

Further, the ion generation apparatus includes a rectangular parallelepiped casing 10 having a rectangular opening slightly larger than printed substrates 5, 6, lid member 11 closing the opening in casing 10, protective cover 12 covering the tip end portions of needle electrodes 1, 2, a circuit substrate 16, a circuit component 17, and a transformer 18.

Casing 10 is formed of an insulating resin. A lower portion of casing 10 is formed to be slightly smaller than its upper portion, and a level difference is formed at a boundary between the upper portion and the lower portion of casing 10 in inner walls of casing 10. Further, the lower portion of casing 10 is divided by a partition plate 10a into two in the longitudinal direction. Transformer 18 is accommodated at the bottom on one side of partition plate 10a. Circuit substrate 16 is provided on partition plate 10a and the level difference to close a space on the other side of partition plate 10a. Circuit component 17 is mounted on a lower surface of circuit substrate 16, and is accommodated in the space on the other side of partition plate 10a.

Printed substrates 5, 6 are accommodated horizontally in the upper portion of casing 10. Circuit substrate 16, transformer 18, and printed substrates 5, 6 are electrically connected by wiring. A resin 19 for insulation is charged in a high-voltage portion within casing 10. Resin 19 is charged up to a lower surface of printed substrate 6. It is noted that, in Embodiment 1, resin 19 is not charged in the space on the other side of partition plate 10a, because it is not necessary to insulate circuit component 17 connected to a primary side of transformer 18 with resin 19.

Lid member 11 is formed of an insulating resin. Grooves are formed in upper end portions of the inner walls of casing 10, and locking portions to be inserted in the grooves in casing 10 protrude at both ends of lid member 11 in the longitudinal direction. In addition, a cylindrical boss 11a is formed in a lower surface of lid member 11 at a position corresponding to hole 5a and needle electrode 1. Further, a cylindrical boss 11b is formed in the lower surface of lid member 11 at a position corresponding to hole 5b and needle electrode 2.

Bosses 11a, 11b have inner diameters larger than outer diameters of needle electrodes 1, 2, respectively. In addition, bosses 11a, 11b have outer diameters smaller than inner diameters of holes 5a, 5b in printed substrate 5, respectively. Bosses 11a, 11b penetrate through holes 5a, 5b in printed substrate 5, respectively. A slight gap is formed between tip end surfaces (lower end surfaces) of bosses 11a, 11b and a surface of printed substrate 6. Needle electrodes 1, 2 penetrate through bosses 11a, 11b, respectively, and the tip end portions of needle electrodes 1, 2 protrude above lid member 11 by about 10 mm.

Protective cover 12 is formed integrally with lid member 11 using an insulating resin. Protective cover 12 includes a top plate 13 and support members 14, 15. Top plate 13 is provided to face an upper surface of lid member 11. Both ends of top plate 13 in the longitudinal direction are fixed to the upper surface of lid member 11 by support members 14, 15, respectively. Holes 13a, 13b are opened in top plate 13 at positions intersecting with center lines of needle electrodes 1, 2, respectively. Each of holes 13a, 13b has an inner diameter of about 6 mm. A lower surface of top plate 13 and tip ends of needle electrodes 1, 2 are provided in a substantially identical plane or to have a slight gap therebetween.

Specifically, when it is assumed that the direction of the long side of printed substrate 6 is defined as an X direction, the direction of the short side of printed substrate 6 is defined as a Y direction, and the direction perpendicular to the surface of printed substrate 6 is defined as a Z direction, two needle electrodes 1, 2 are aligned in the X direction with being oriented in the Z direction, and protrude from casing 10 and lid member 11. Further, protective cover 12 is provided with two holes 13a, 13b opened to allow the tip ends of two needle electrodes 1, 2 to be seen from the Z direction, respectively, and an opening opened to allow needle electrodes 1, 2 to be seen from the Y direction.

Figure 4:
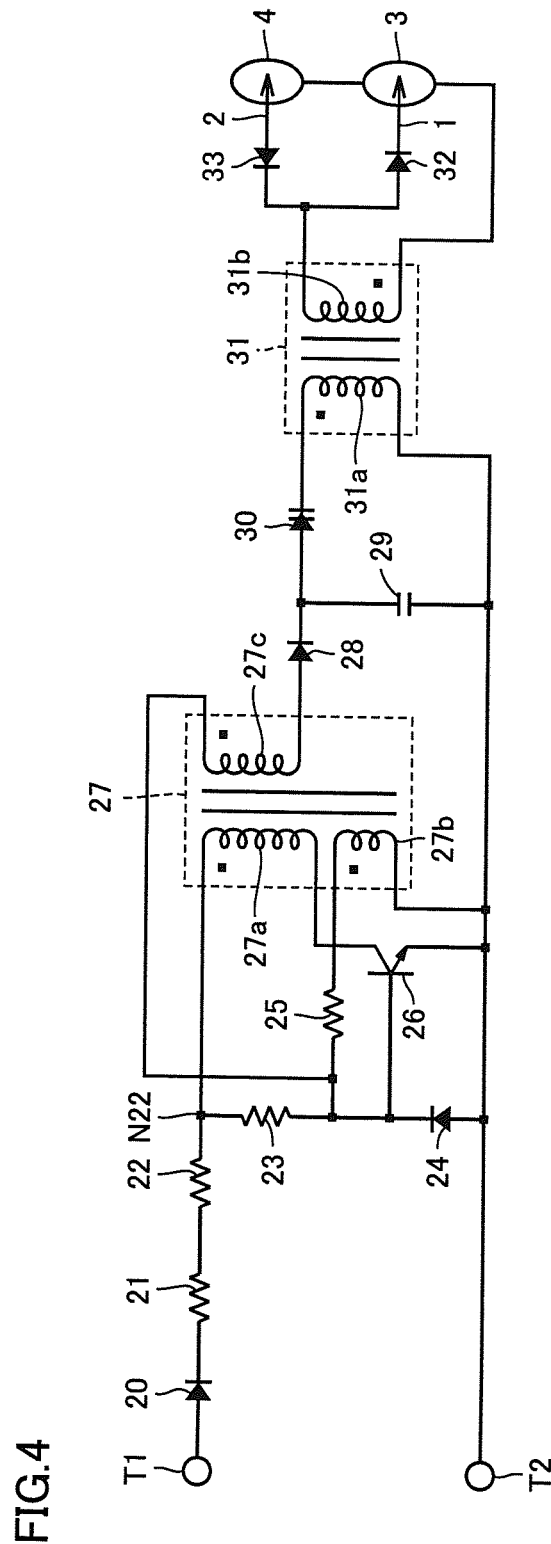
FIG. 4 is a circuit diagram showing a configuration of the ion generation apparatus shown in FIG. 1.

FIG. 4 is a circuit diagram showing a configuration of the ion generation apparatus. In FIG. 4, the ion generation apparatus includes, in addition to needle electrodes 1, 2 and induction electrodes 3, 4, a power supply terminal T1, a ground terminal T2, diodes 20, 24, 28, 32, and 33, resistance elements 21 to 23 and 25, an NPN bipolar transistor 26, boost transformers 27 and 31, a capacitor 29, and a diode thyristor 30. A portion of the circuit in FIG. 4 other than needle electrodes 1, 2 and induction electrodes 3, 4 is constituted by circuit substrate 16, circuit component 17, transformer 18, and the like in FIG. 1.

A positive terminal and a negative terminal of a direct current (DC) power supply are connected to power supply terminal T1 and ground terminal T2, respectively. A DC power supply voltage (for example, +12V or +15V) is applied to power supply terminal T1, and ground terminal T2 is grounded. Diode 20 and resistance elements 21 to 23 are connected in series between power supply terminal T1 and a base of transistor 26. An emitter of transistor 26 is connected to ground terminal T2. Diode 24 is connected between ground terminal T2 and the base of transistor 26.

Diode 20 is an element for protecting the DC power supply by blocking a current when the positive terminal and the negative terminal of the DC power supply are reversely connected to terminals T1 and T2. Resistance elements 21 and 22 are elements for limiting a boost operation. Resistance element 23 is a starting resistance element. Diode 24 operates as a reverse voltage protection element for transistor 26.

Boost transformer 27 includes a primary winding 27a, a base winding 27b, and a secondary winding 27c. Primary winding 27a has one terminal connected to a node N22 between resistance elements 22 and 23, and the other terminal connected to a collector of transistor 26. Base winding 27b has one terminal connected to the base of transistor 26 via resistance element 25, and the other terminal connected to ground terminal T2. Secondary winding 27c has one terminal connected to the base of transistor 26, and the other terminal connected to ground terminal T2 via diode 28 and capacitor 29.

Boost transformer 31 includes a primary winding 31a and a secondary winding 31b. Diode thyristor 30 is connected between a cathode of diode 28 and one terminal of primary winding 31a. The other terminal of primary winding 31a is connected to ground terminal T2. Secondary winding 31b has one terminal connected to induction electrodes 3 and 4, and the other terminal connected to an anode of diode 32 and a cathode of diode 33. A cathode of diode 32 is connected to the base end portion of needle electrode 1, and an anode of diode 33 is connected to the base end portion of needle electrode 2.

Resistance element 25 is an element for limiting a base current. Diode thyristor 30 is an element that becomes conductive when a voltage across terminals reaches a breakover voltage, and becomes nonconductive when a current is reduced to a minimum holding current or less.

Next, an operation of the ion generation apparatus will be described. Capacitor 29 is charged by an operation of an RCC-type switching power supply. Specifically, when the DC power supply voltage is applied across power supply terminal T1 and ground terminal T2, a current flows from power supply terminal T1 to the base of transistor 26 via diode 20 and resistance elements 21 to 23, and transistor 26 becomes conductive. Thereby, a current flows to primary winding 27a of boost transformer 27, and a voltage is generated across terminals of base winding 27b.

The winding direction of base winding 27b is set to further increase a base voltage of transistor 26 when transistor 26 becomes conductive. Therefore, the voltage generated across the terminals of base winding 27b reduces a conductive resistance value of transistor 26 in a positive feedback state. The winding direction of secondary winding 27c is set such that diode 28 blocks energization on this occasion, and no current flows to secondary winding 27c.

As the current flowing to primary winding 27a and transistor 26 continues to increase in this manner, a collector voltage of transistor 26 is increased beyond a saturation region. Thereby, a voltage across the terminals of primary winding 27a is reduced, the voltage across the terminals of base winding 27b is also reduced, and thus the collector voltage of transistor 26 is further increased. Accordingly, transistor 26 operates in the positive feedback state, and transistor 26 immediately becomes nonconductive. On this occasion, secondary winding 27c generates a voltage in a conducting direction of diode 28. Thereby, capacitor 29 is charged.

When a voltage across terminals of capacitor 29 is increased to reach the breakover voltage of diode thyristor 30, diode thyristor 30 operates like a Zener diode and further passes a current. When the current flowing to diode thyristor 30 reaches a breakover current, diode thyristor 30 is substantially short-circuited, and an electric charge charged in capacitor 29 is discharged via diode thyristor 30 and primary winding 31a of boost transformer 31, generating an impulse voltage in primary winding 31a.

When the impulse voltage is generated in primary winding 31a, positive and negative high-voltage pulses are alternately generated in an attenuating manner in secondary winding 31b. The positive high-voltage pulses are applied to needle electrode 1 via diode 32, and the negative high-voltage pulses are applied to needle electrode 2 via diode 33. Thereby, corona discharge occurs at the tip ends of needle electrodes 1, 2, and positive ions and negative ions are generated, respectively.

On the other hand, when a current flows to secondary winding 27c of boost transformer 27, the voltage across the terminals of primary winding 27a is increased and transistor 26 becomes conductive again, and the operation described above is repeated. The speed of repeating the operation is increased with an increase in the current flowing to the base of transistor 26. Therefore, by adjusting a resistance value of resistance element 21, the current flowing to the base of transistor 26 can be adjusted, and thus the number of discharges of needle electrodes 1, 2 can be adjusted.

It is noted that positive ions are cluster ions formed in such a manner that a plurality of water molecules surround a hydrogen ion ($H^+$), and expressed as $H^+(H_2O)_m$, (m is any natural number). In addition, negative ions are cluster ions formed in such a manner that a plurality of water molecules surround an oxygen ion ($O_2^-$), and expressed as $O_2^-(H_2O)_n$ (n is any natural number). When positive ions and negative ions are emitted into a room, both ions surround molds and viruses floating in the air, and cause a chemical reaction with each other on the surfaces thereof. As a result of action of hydroxyl radicals (●OH) representing active species produced at that time, floating molds and the like are eliminated.

Figure 5:
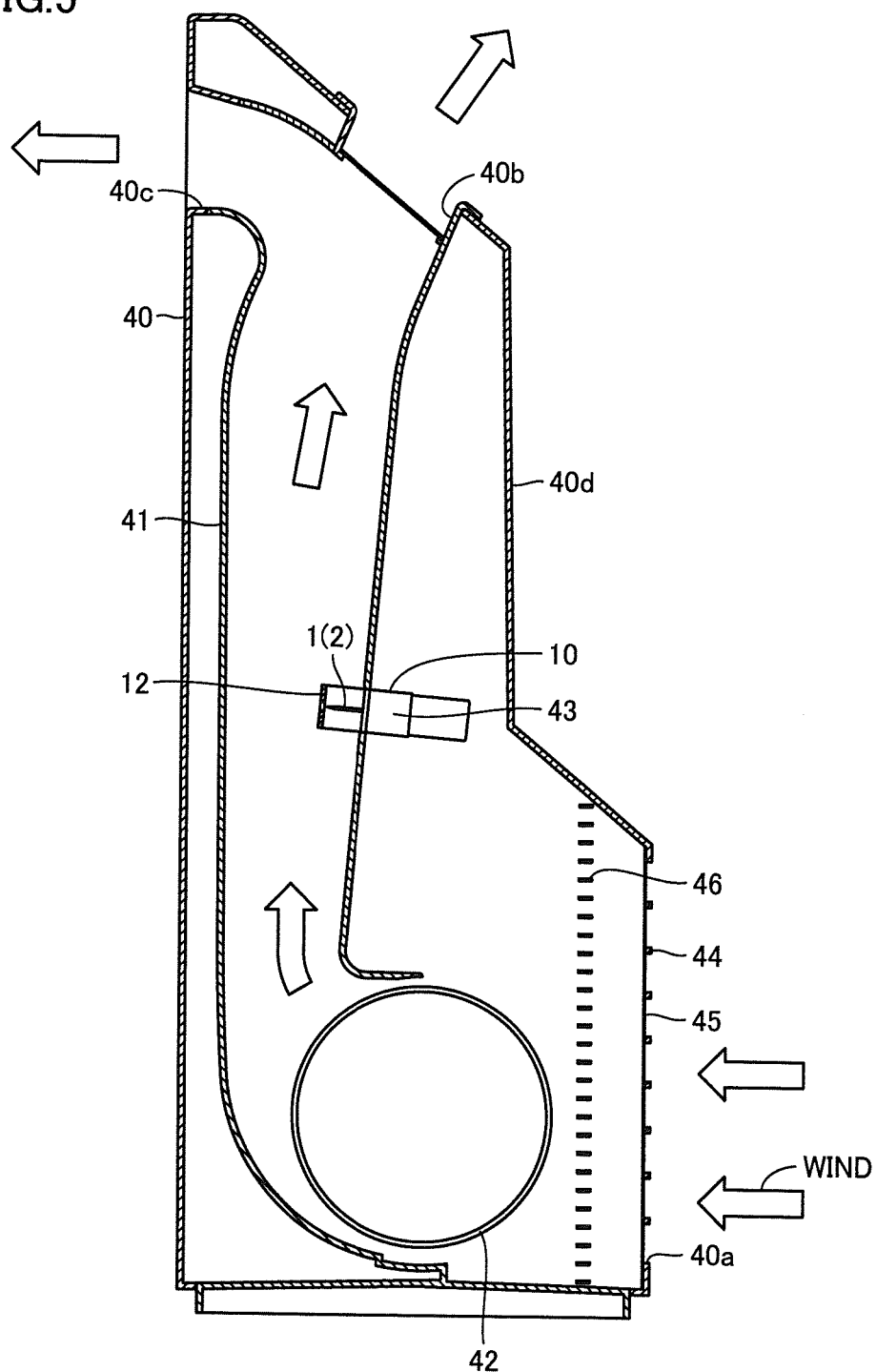
FIG. 5 is a cross sectional view showing a configuration of an air cleaner using the ion generation apparatus shown in FIG. 1.

FIG. 5 is a cross sectional view showing a configuration of an air cleaner using the ion generation apparatus shown in FIGS. 1 to 4. In FIG. 5, in the air cleaner, an inlet 40a is provided in a back surface of a lower portion of a main body 40, and outlets 40b, 40c are provided in a back surface and a front surface, respectively, of an upper portion of main body 40. Further, a duct 41 is provided inside main body 40, an opening at a lower end of duct 41 is provided to face inlet 40a, and an upper end of duct 41 is connected to outlets 40b, 40c.

A cross flow fan 42 is provided in the opening at the lower end of duct 41, and an ion generation apparatus 43 is provided at a central portion of duct 41. Ion generation apparatus 43 is the one shown in FIGS. 1 to 4. Casing 10 of ion generation apparatus 43 is fixed to an outer wall surface of duct 41, and needle electrodes 1, 2 and protective cover 12 thereof penetrate through a wall of duct 41 and protrude into duct 41. Two needle electrodes 1, 2 are aligned in a direction (X direction) perpendicular to a direction in which the air inside duct 41 flows (Y direction).

Further, a lattice grill 44 made of a resin is provided at inlet 40a, and a thin mesh filter 45 is attached to the inside of grill 44. A fan guard 46 is provided behind filter 45 to prevent a foreign substance or a user's finger from entering cross flow fan 42.

When cross flow fan 42 is rotationally driven, the air in a room is taken into duct 41 via inlet 40a. Molds and the like contained in the intake air are eliminated by ions generated by ion generation apparatus 43. The cleaned air passing through ion generation apparatus 43 is emitted into the room via outlets 40b, 40c.

Figure 6:
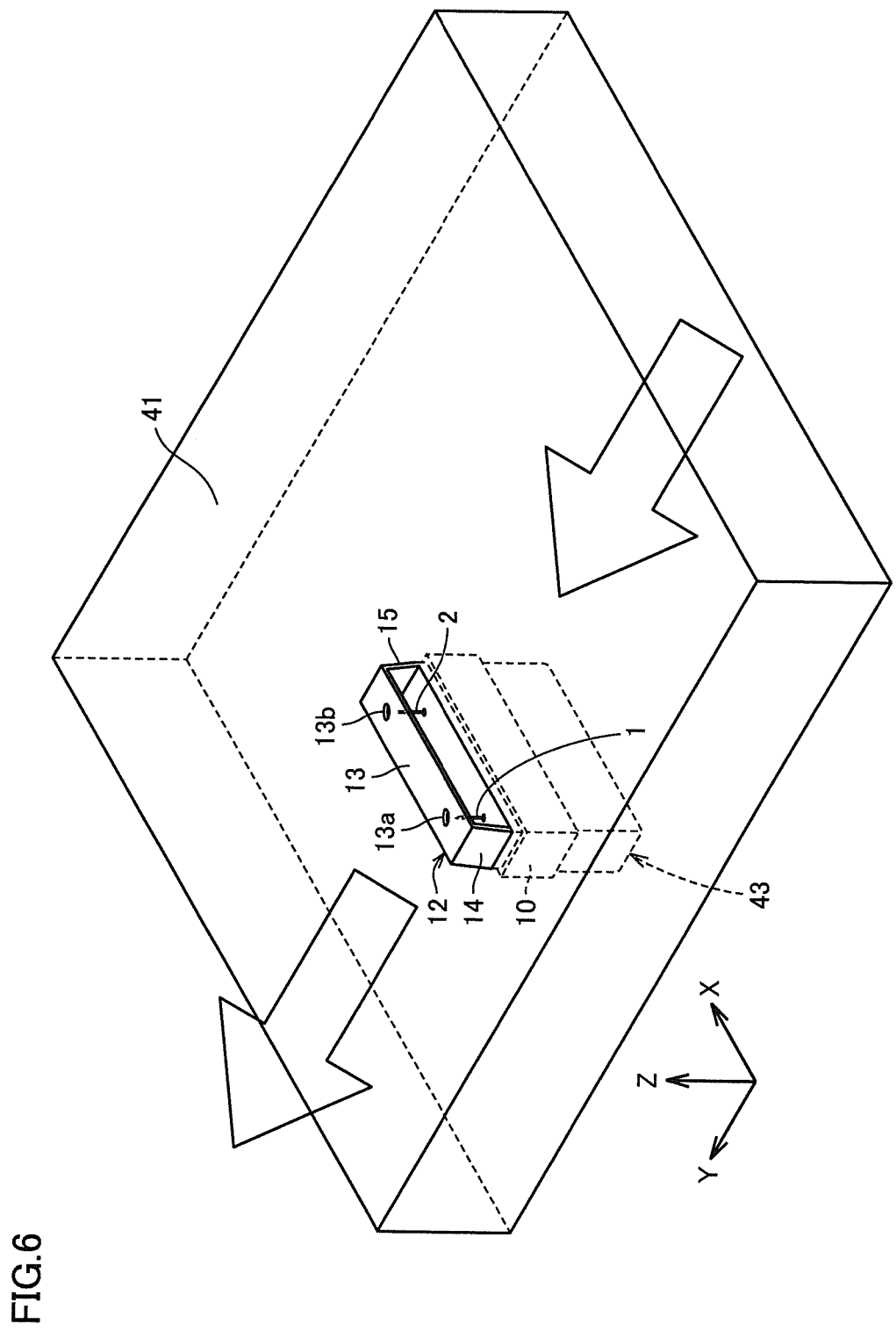
FIG. 6 is a view showing the relation between a direction of wind inside a duct shown in FIG. 5 and a direction in which needle electrodes 1, 2 are aligned.

FIG. 6 is a perspective view showing the relation between the direction of wind inside duct 41 and the direction in which needle electrodes 1, 2 are aligned. As shown in FIG. 6, needle electrodes 1, 2 and protective cover 12 of ion generation apparatus 43 penetrate through the wall of duct 41 and protrude into duct 41. Two needle electrodes 1, 2 are aligned in the direction (X direction) perpendicular to the direction in which the air inside duct 41 flows (Y direction), with the tip ends being oriented in the Z direction.

Further, a space inside duct 41 is divided by protective cover 12 into a space inside protective cover 12 (i.e., on the side of needle electrodes 1, 2) and a space outside protective cover 12. Since holes 13a, 13b are opened in top plate 13 of protective cover 12 at positions corresponding to needle electrodes 1, 2, the space inside protective cover 12 and the space outside protective cover 12 are in communication with each other via holes 13a, 13b.

When a high voltage is applied to needle electrodes 1, 2, electric fields are each formed between needle electrode 1, 2 and induction electrode 3, 4, and corona discharge occurs at the tip end portions of needle electrodes 1, 2, generating ions. Here, if top plate 13 of protective cover 12 is located in an immediate vicinity of the tip ends of needle electrodes 1, 2, the electric fields each generated between needle electrode 1, 2 and induction electrode 3, 4 are disturbed by top plate 13. In Embodiment 1, however, holes 13a, 13b are opened in top plate 13, which can suppress the electric fields each generated between needle electrode 1, 2 and induction electrode 3, 4 from being disturbed by top plate 13.

In addition, ion generation apparatus 43 is replaced by the user after it is operated for a predetermined period of time. When the user replaces ion generation apparatus 43, the user can access ion generation apparatus 43 placed in duct 41 by removing a back lid 40d at the back surface of main body 40 of the air cleaning apparatus. On this occasion, since the tip ends of needle electrodes 1, 2 are arranged on a more inner side than holes 13a, 13b in top plate 13, even if the user holds top plate 13, the user's finger does not enter hole 13a, 13b, and thus the user is prevented from touching the tip end portion of needle electrode 1, 2 and injuring his or her finger.

Although some ion generation apparatuses are not replaced by a user, also in that case, ion generation apparatus 43 in accordance with the invention of the present application can prevent an operator from touching the tip end portion of needle electrode 1, 2 and injuring his or her finger during manufacturing thereof.

Further, the air passing through duct 41 by the rotation of cross flow fan 42 is divided by protective cover 12 of ion generation apparatus 43 into the air passing through the inside of protective cover 12 and the air passing through the outside of protective cover 12. The air passing through the inside of protective cover 12 directly impinges on needle electrodes 1, 2, and transports ions generated on the periphery of the tip end portions of needle electrodes 1, 2 on the air flow, toward a downstream side of duct 41. On the other hand, the air passing through the outside of protective cover 12 sweeps ions generated on the periphery of the electric fields generated outward from holes 13a, 13b in top plate 13, and transports the ions toward the downstream side of duct 41. On this occasion, top plate 13 serves as a flow control plate for controlling the flow of the air passing through the periphery of needle electrodes 1, 2. Thus, ions generated on the periphery of needle electrodes 1, 2 can efficiently be guided toward the downstream side of duct 41 and emitted from outlets 40b, 40c.

As described above, in Embodiment 1, since the tip end portions of needle electrodes 1, 2 protrude from casing 10 and lid member 11, ions generated at the tip end portions of needle electrodes 1, 2 can be emitted efficiently out of casing 10. Further, since protective cover 12 covering the tip end portions of needle electrodes 1, 2 is provided, protective cover 12 can prevent the user from touching the tip end portion of needle electrode 1, 2 and injuring his or her finger or the like.

Further, since holes 13a, 13b are opened in top plate 13 of protective cover 12 to allow the tip ends of needle electrodes 1, 2 to be seen from the Z direction, respectively, holes 13a, 13b can prevent the electric fields generated on the periphery of the tip end portions of needle electrodes 1, 2 from being disturbed by protective cover 12 and causing a reduction in the amount of generated ions. Furthermore, since the opening is provided in protective cover 12 to allow needle electrodes 1, 2 to be seen from the Y direction, ions can be delivered efficiently by blowing the air in the Y direction.

Further, since top plate 13 is supported by support members 14, 15 on both sides of needle electrodes 1, 2 as viewed from the Y direction, the user can be more effectively prevented from touching the tip end portion of needle electrode 1, 2 and injuring his or her finger or the like.

Further, since induction electrodes 3, 4 are mounted on printed substrate 5 and needle electrodes 1, 2 are mounted on printed substrate 6, even if the ion generation apparatus is placed in a high-humidity environment with dust accumulating on printed substrates 5, 6, the ion generation apparatus can prevent a current from leaking between needle electrode 1, 2 and induction electrode 3, 4, and can generate ions stably.

Further, since printed substrates 5, 6 are covered with lid member 11, accumulation of dust on printed substrates 5, 6 can be prevented. Furthermore, even if dust enters through bosses 11a, 11b, the dust is less likely to accumulate on printed substrate 5, although the dust may accumulate on printed substrate 6. In addition, since bosses 11a, 11b of lid member 11 are inserted in holes 5a, 5b in printed substrate 5, respectively, and needle electrodes 1, 2 are inserted in bosses 11a, 11b, respectively, a spatial distance between needle electrode 1, 2 and induction electrode 3, 4 can be increased. Therefore, the ion generation apparatus can prevent a current from leaking between needle electrode 1, 2 and induction electrode 3, 4 more effectively.

Further, since the tip end portions of needle electrodes 1, 2 penetrate through bosses 11a, 11b and protrude above lid member 11, even if dust accumulates in the vicinity of openings of bosses 11a, 11b, the ion generation apparatus can prevent the dust from burying the tip end portions of needle electrodes 1, 2 and disturbing discharge of needle electrodes 1, 2. Furthermore, even if dust sticks to the tip end portions of needle electrodes 1, 2, the dust can be blown off needle electrodes 1, 2 by applying a high voltage to needle electrodes 1, 2 while blowing the air to the tip end portions of needle electrodes 1, 2.

Further, since induction electrodes 3, 4 are formed using the wiring layers of printed substrate 5, induction electrodes 3, 4 can be formed at a low cost, and the cost of the ion generation apparatus can be reduced.

It is noted that, although the tip ends of needle electrodes 1, 2 protrude above lid member 11 in Embodiment 1, the tip ends of needle electrodes 1, 2 may be lower than the upper surface of lid member 11.

Further, although induction electrodes 3, 4 are formed using the wiring layers of printed substrate 5 in Embodiment 1, each of induction electrodes 3, 4 may be formed of a metal plate. In addition, each of induction electrodes 3, 4 may not be annular.

[Embodiment 2]

Figure 7:
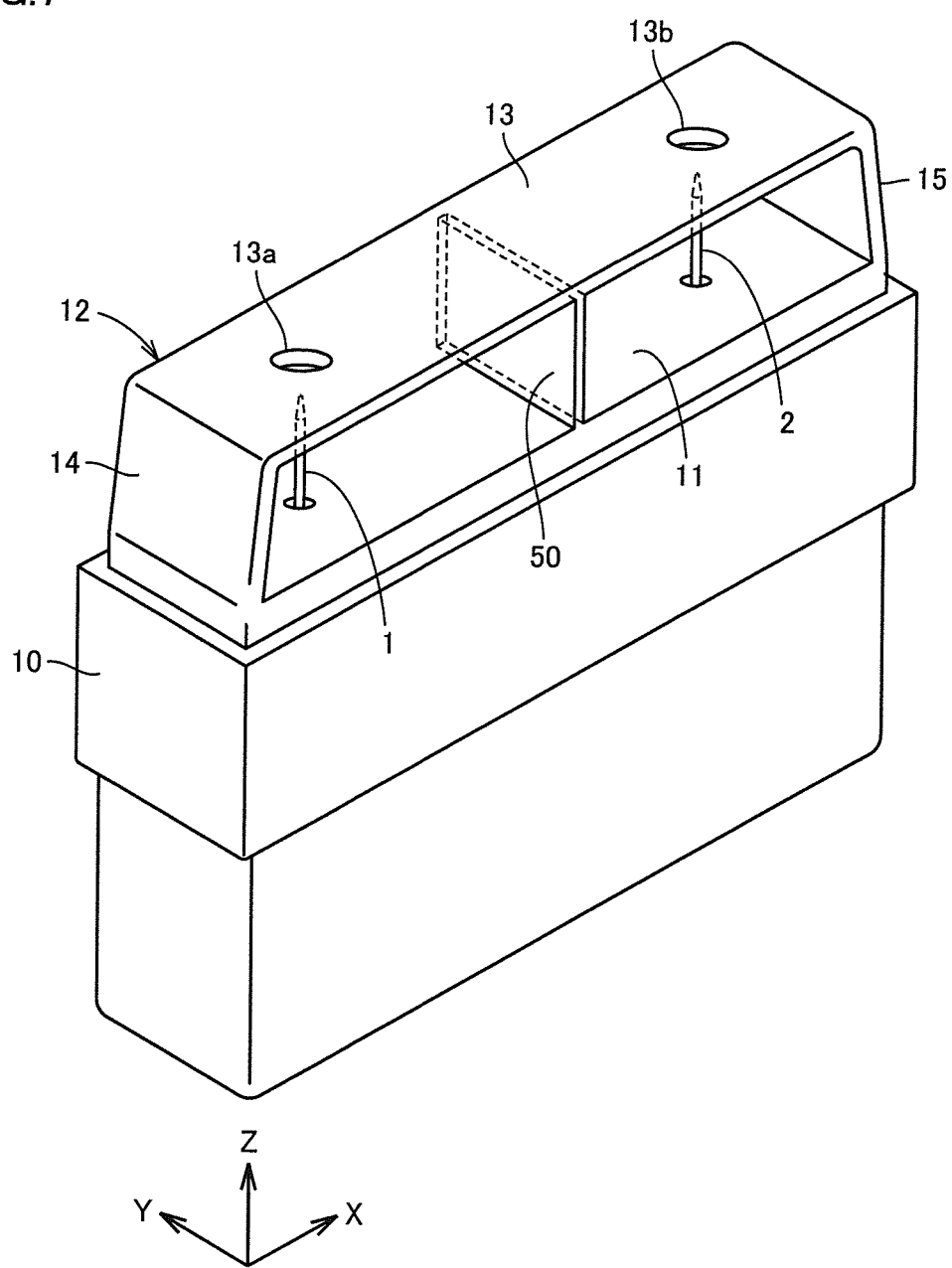
FIG. 7 is a perspective view showing a configuration of an ion generation apparatus in accordance with Embodiment 2 of the present invention.

FIG. 7 is a perspective view showing an ion generation apparatus in accordance with Embodiment 2 of the present invention, which is compared with FIG. 2. In FIG. 7, the ion generation apparatus is different from the ion generation apparatus in FIG. 2 in that a rib 50 in the shape of a flat plate is provided at an intermediate position between needle electrodes 1, 2.

Rib 50 is arranged parallel to a YZ plane, and connected between lid member 11 and top plate 13. A space between lid member 11 and top plate 13 is divided by rib 50 into two. Since rib 50 is arranged parallel to a YZplane, when rib 50 is arranged inside duct 41 as shown in FIG. 6, rib 50 allows the wind inside duct 41 to flow smoothly.

Further, since rib 50 separates a space provided with needle electrode 1 for generating positive ions from a space provided with needle electrode 2 for generating negative ions, rib 50 can prevent an electric field generated by one of needle electrodes 1, 2 from adversely affecting an electric field generated by the other needle electrode. Furthermore, since the air containing positive ions and the air containing negative ions are less likely to be mixed, a phenomenon that positive ions and negative ions collide with each other, are neutralized and deactivated, and disappear is less likely to occur. Therefore, as a result, concentrations of positive ions and negative ions generated by the ion generation apparatus are increased.

Further, since rib 50 increases the strength of protective cover 12, even if the user holds protective cover 12 during replacement of the ion generation apparatus, rib 50 can prevent protective cover 12 from being broken.

Figure 8:
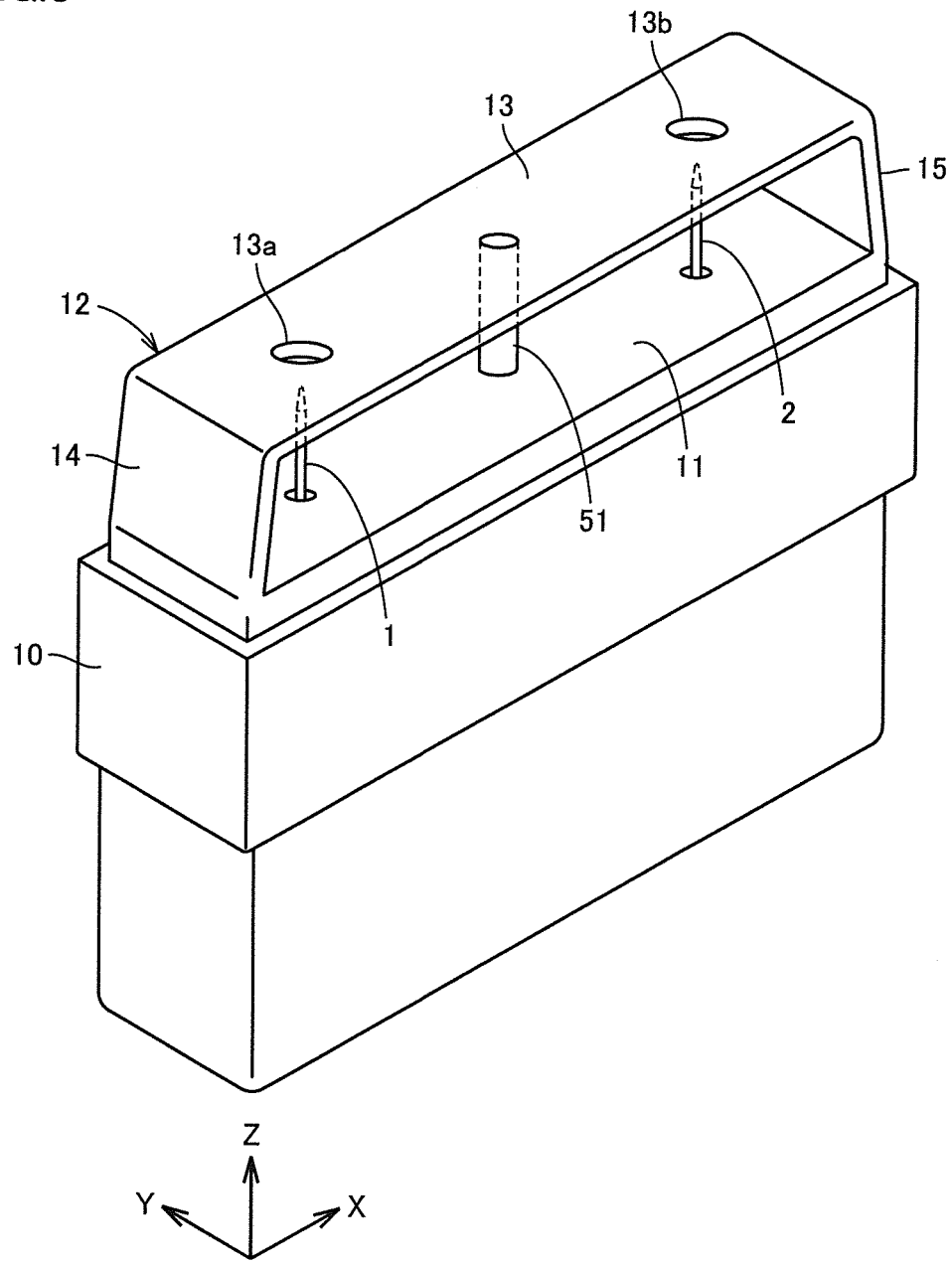
FIG. 8 is a perspective view showing a modification of Embodiment 2.

It is noted that rib 50 in the shape of a flat plate may be replaced with a rib 51 in the shape of a column, as shown in FIG. 8. Rib 51 extends in the Z direction, and is connected between lid member 11 and top plate 13. Also in this case, the same effect as that in Embodiment 2 can be obtained. Further, when needle electrodes 1, 2 are provided inside duct 41, even if an angle between the direction in which needle electrodes 1, 2 are aligned (X direction) and the direction in which the air inside duct 41 flows is slightly deviated from 90 degrees, rib 51 allows the air to flow smoothly without disturbing the air flow.

Figure 9:
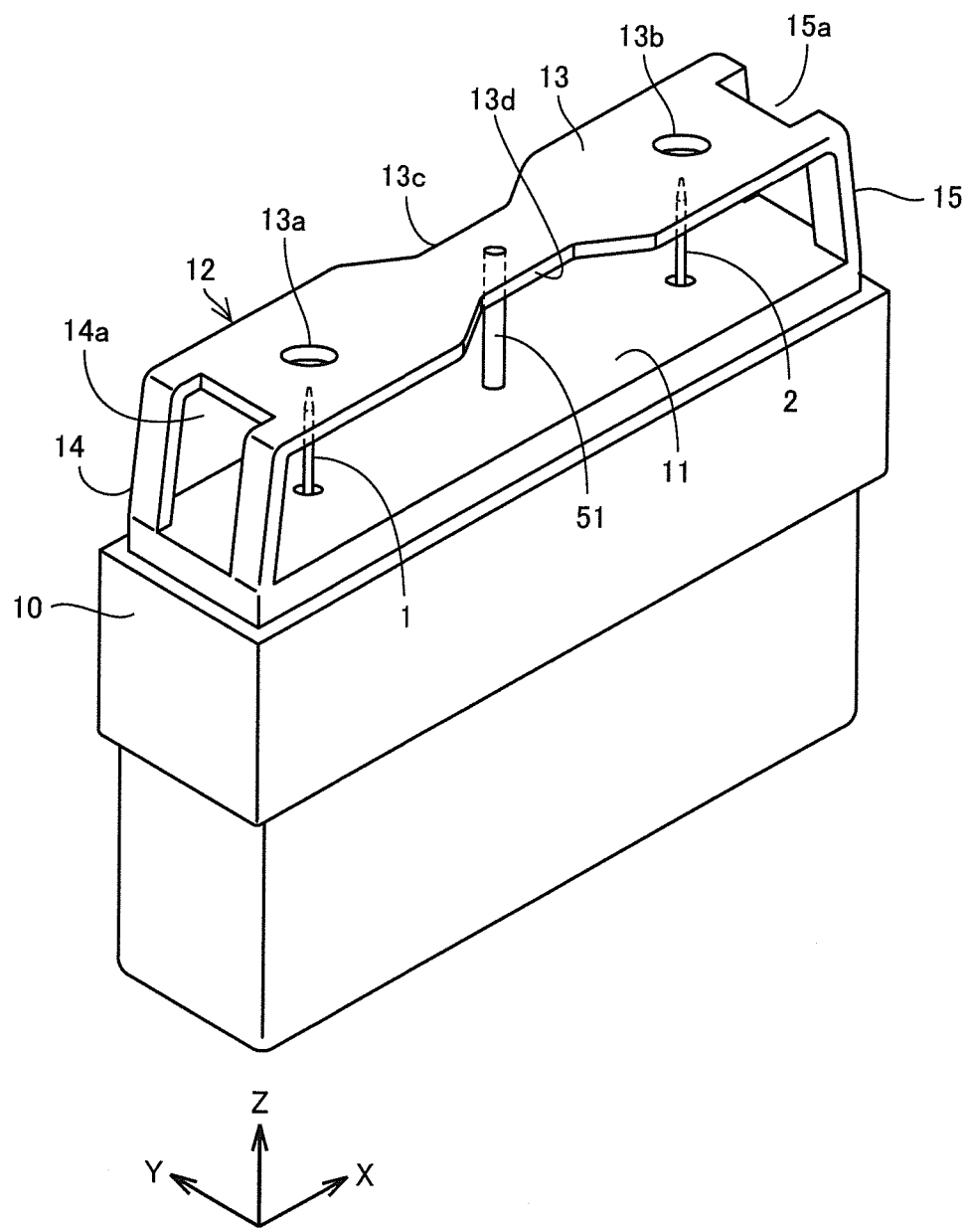
FIG. 9 is a perspective view showing another modification of Embodiment 2.

Further, support members 14, 15 may be provided with openings 14*a*, 15*a*, respectively, and top plate 13 may be provided with cutout portions 13*c*, 13*d*, as shown in FIG. 9. Support members 14, 15 are divided by openings 14*a*, 15*a*, respectively, into two, and only four corners of top plate 13 are supported by support members 14, 15. In addition, a central portion of top plate 13 has a width narrowed by cutout portions 13*c*, 13*d*. In this case, the air can flow more easily.

Further, since support members 14, 15 are provided with openings 14*a*, 15*a* to allow needle electrode 1 or 2 to be seen from the X direction, the air can be blown not only in the Y direction but also in the X direction and in a direction between the X direction and the Y direction to deliver ions.

Specifically, in FIG. 6, ion generation apparatus 43 is arranged such that the direction in which two needle electrodes 1, 2 are aligned (X direction) is perpendicular to the direction in which the air inside duct 41 flows. In a case where duct 41 has a width sufficiently larger than the dimension of ion generation apparatus 43 in the X direction, ion generation apparatus 43 can be arranged as shown in FIG. 6.

However, in a case where the duct has a width smaller than the dimension of the ion generation apparatus in the X direction, the ion generation apparatus cannot be arranged as shown in FIG. 6, and it is necessary to orient the X direction of the ion generation apparatus in a direction oblique to or identical to the direction in which the air inside the duct flows. In this case, it is preferable to use the ion generation apparatus shown in FIG. 9.

Figure 10:
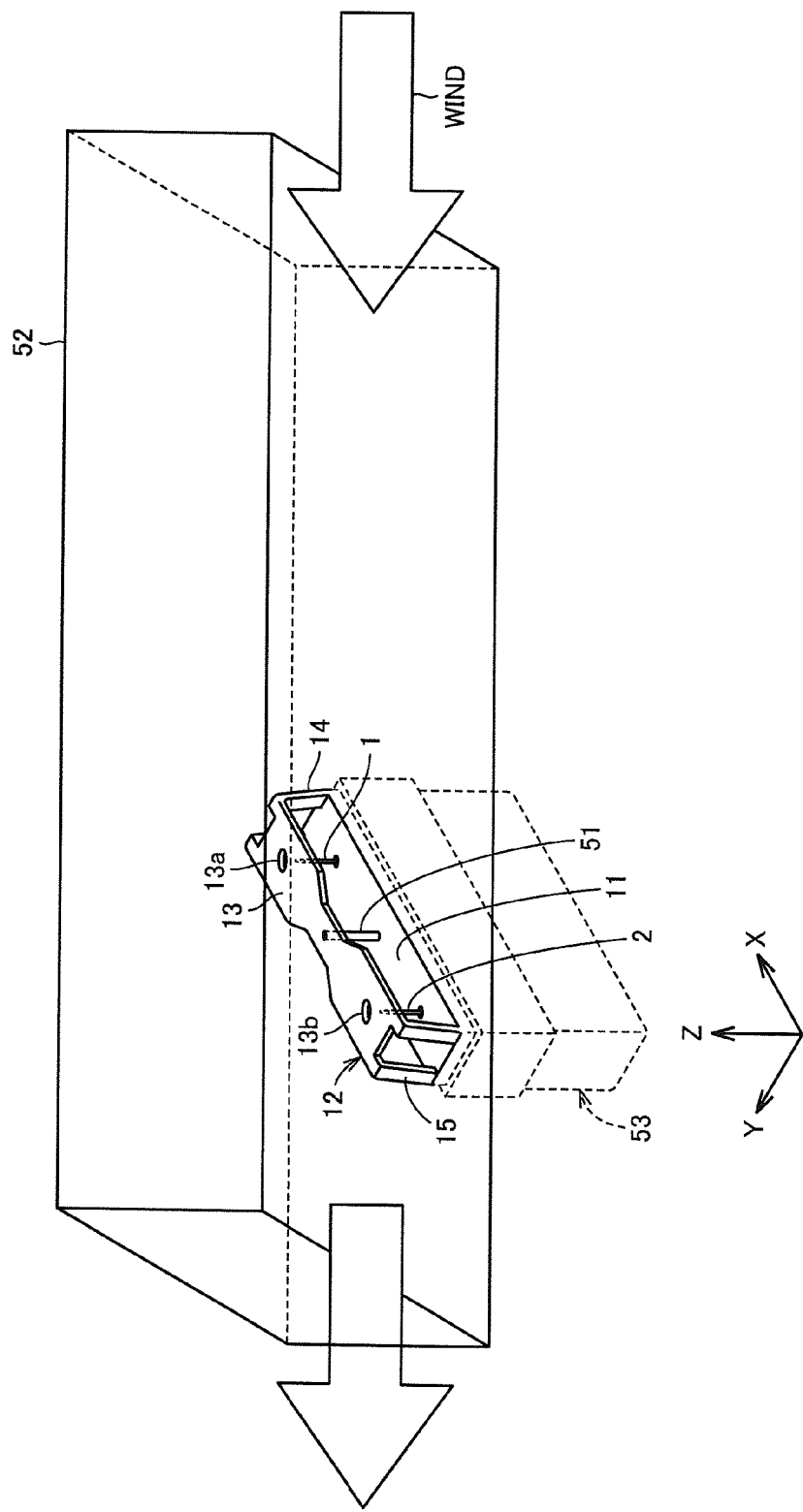
FIG. 10 is a view showing a method of using an ion generation apparatus shown in FIG. 9.
Figure 11:
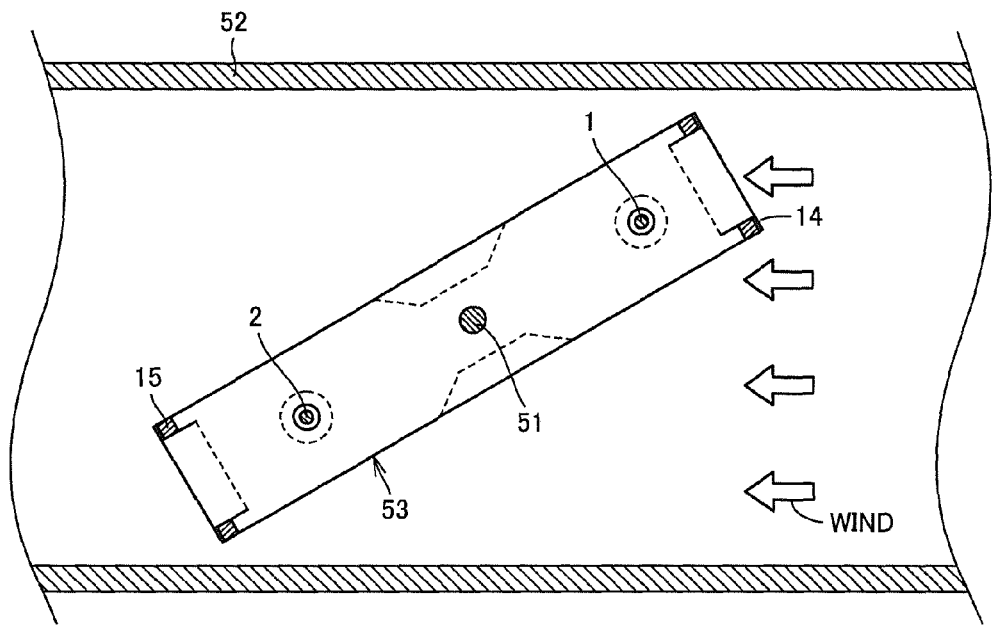
FIG. 11 is a cross sectional view of the ion generation apparatus and a duct shown in FIG. 10 as viewed from above.

FIG. 10 is a view showing a state where an ion generation apparatus 53 is arranged obliquely inside a duct 52 with a smaller width. Further, FIG. 11 is a cross sectional view of duct 52 and ion generation apparatus 53 as viewed from above. Ion generation apparatus 53 is the ion generation apparatus shown in FIG. 9.

In FIGS. 10 and 11, needle electrodes 1, 2 and protective cover 12 of ion generation apparatus 53 penetrate through a wall of duct 52 and protrude into duct 52. Two needle electrodes 1, 2 are aligned in a direction (X direction) oblique to a direction in which the air inside duct 52 flows, with tip ends being oriented in the Z direction. The direction in which the air inside duct 52 flows intersects with the direction in which needle electrodes 1, 2 are aligned (X direction) at about 60 degrees. Needle electrode 1 for generating positive ions is arranged on an upstream side of the air flow, and needle electrode 2 for generating negative ions is arranged on a downstream side of the air flow.

The air inside duct 52 passes through a gap between top plate 13 and lid member 11, openings 14*a*, 15*a* in support members 14, 15, and the like, and transports ions generated on the periphery of the tip end portions of needle electrodes 1, 2 on the air flow, toward a downstream side of duct 52. Therefore, in this modification, even when ion generation apparatus 53 is arranged oblique to the air flow, the air is allowed to flow smoothly, and a large amount of generated ions can be ensured.

Figure 12:
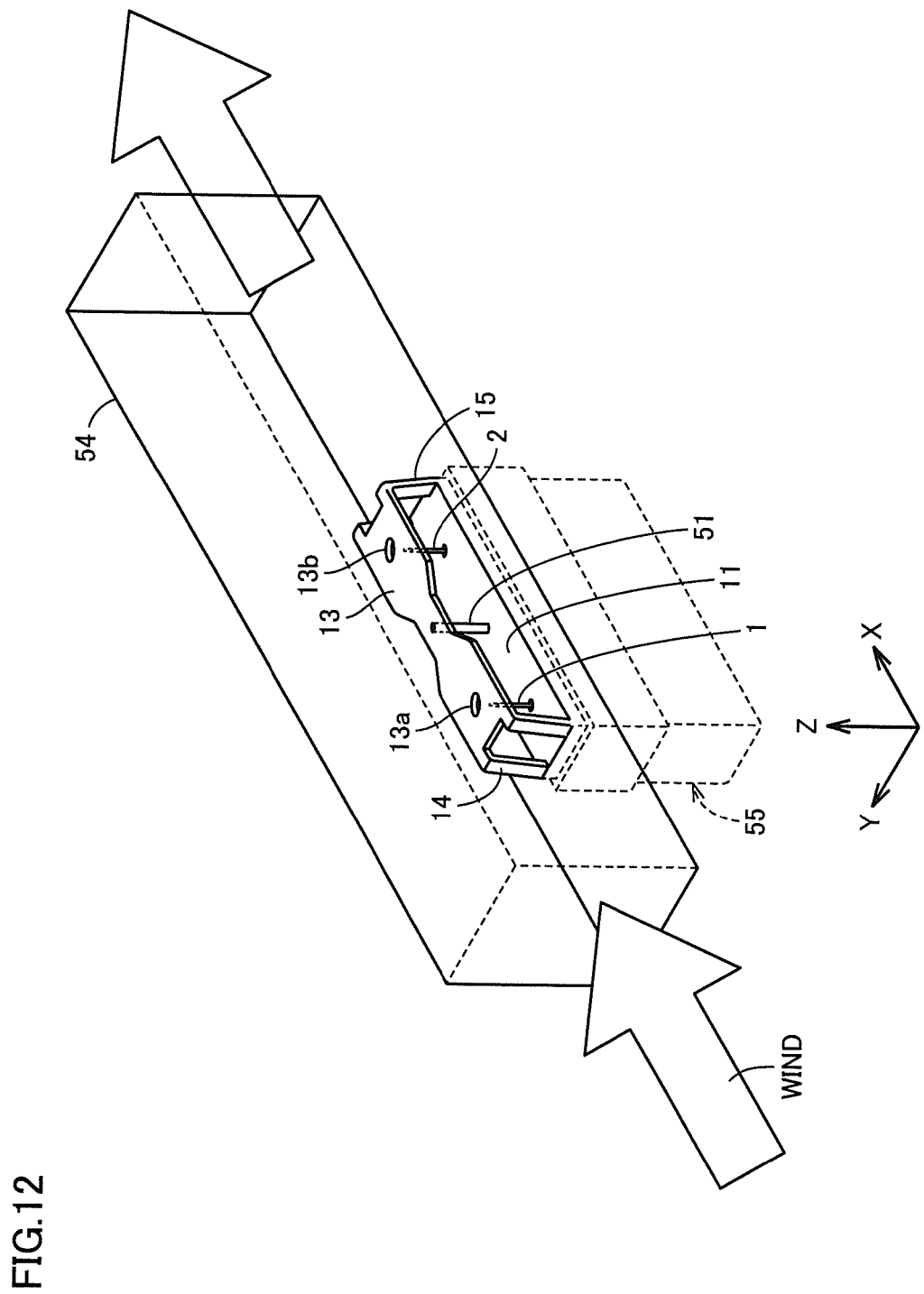
FIG. 12 is a view showing another method of using the ion generation apparatus shown in FIG. 9.

Further, FIG. 12 is a view showing a state where an ion generation apparatus 55 is arranged inside a duct 54 with a further smaller width. Ion generation apparatus 55 is the ion generation apparatus shown in FIG. 9. In FIGS. 12, needle electrodes 1, 2 and protective cover 12 of ion generation apparatus 55 penetrate through a wall of duct 54 and protrude into duct 54. Two needle electrodes 1, 2 are aligned in a direction (X direction) identical to a direction in which the air inside duct 54 flows, with tip ends being oriented in the Z direction. The direction in which the air inside duct 52 flows is identical to the direction in which needle electrodes 1, 2 are aligned (X direction). Needle electrode 1 for generating positive ions is arranged on an upstream side of the air flow, and needle electrode 2 for generating negative ions is arranged on a downstream side of the air flow.

The air inside duct 54 passes through a gap between top plate 13 and lid member 11, openings 14*a*, 15*a* in support members 14, 15, and the like, and transports ions generated on the periphery of the tip end portions of needle electrodes 1, 2 on the air flow, toward a downstream side of duct 54. Therefore, in this modification, even when needle electrodes 1, 2 of ion generation apparatus 55 are arranged in the same direction as that of the air flow, the air is allowed to flow smoothly, and a large amount of generated ions can be ensured.

FIG. 13 is a view showing the effect of openings 14*a*, 15*a* in support members 14, 15. For each of four cases, the amount of ions was measured at a predetermined position downstream of the air flow, under the conditions of a wind speed on the periphery of the ion generation apparatus of about 5 m/second, a temperature of 30° C., and a humidity of 40%.

Firstly, as shown in the first column in FIG. 13 at the left end, using ion generation apparatus 43 having no openings 14*a*, 15*a* in support members 14, 15 (see FIG. 6), the air was blown in a direction identical to the direction in which needle electrodes 1, 2 were aligned (X direction), and the amount of ions was measured. In this case, the amount of ions was about 6.5 million/cm$^3$.

Next, as shown in the second column in FIG. 13, using ion generation apparatus 55 having openings 14*a*, 15*a* in support members 14, 15 (see FIG. 12), the air was blown in the direction identical to the direction in which needle electrodes 1, 2 were aligned (X direction), and the amount of ions was measured. In this case, the amount of ions was about 9 million/cm$^3$. As is clear from the first and the second columns in FIG. 13, the amount of ions was able to be increased by about 1.4 times by opening openings 14*a*, 15*a* in support members 14, 15.

Further, as shown in the third column in FIG. 13, using ion generation apparatus 43 having no openings 14*a*, 15*a* in support members 14, 15 (see FIG. 6), the air was blown from a direction oblique to the direction in which needle electrodes 1, 2 were aligned (X direction) by about 30 degrees, and the amount of ions was measured. In this case, the amount of ions was about 8 million/cm$^3$.

Furthermore, as shown in the fourth column in FIG. 13 at the right end, using ion generation apparatus 53 having openings 14*a*, 15*a* in support members 14, 15 (see FIG. 10), the air was blown from the direction oblique to the direction in which needle electrodes 1, 2 were aligned (X direction) by about 30 degrees, and the amount of ions was measured. In this case, the amount of ions was about 10 million/cm$^3$. As is clear from the third and the fourth columns in FIG. 13, the amount of ions was able to be increased by about 1.2 times by opening openings 14*a*, 15*a* in support members 14, 15.

[Embodiment 3]

Figure 14:
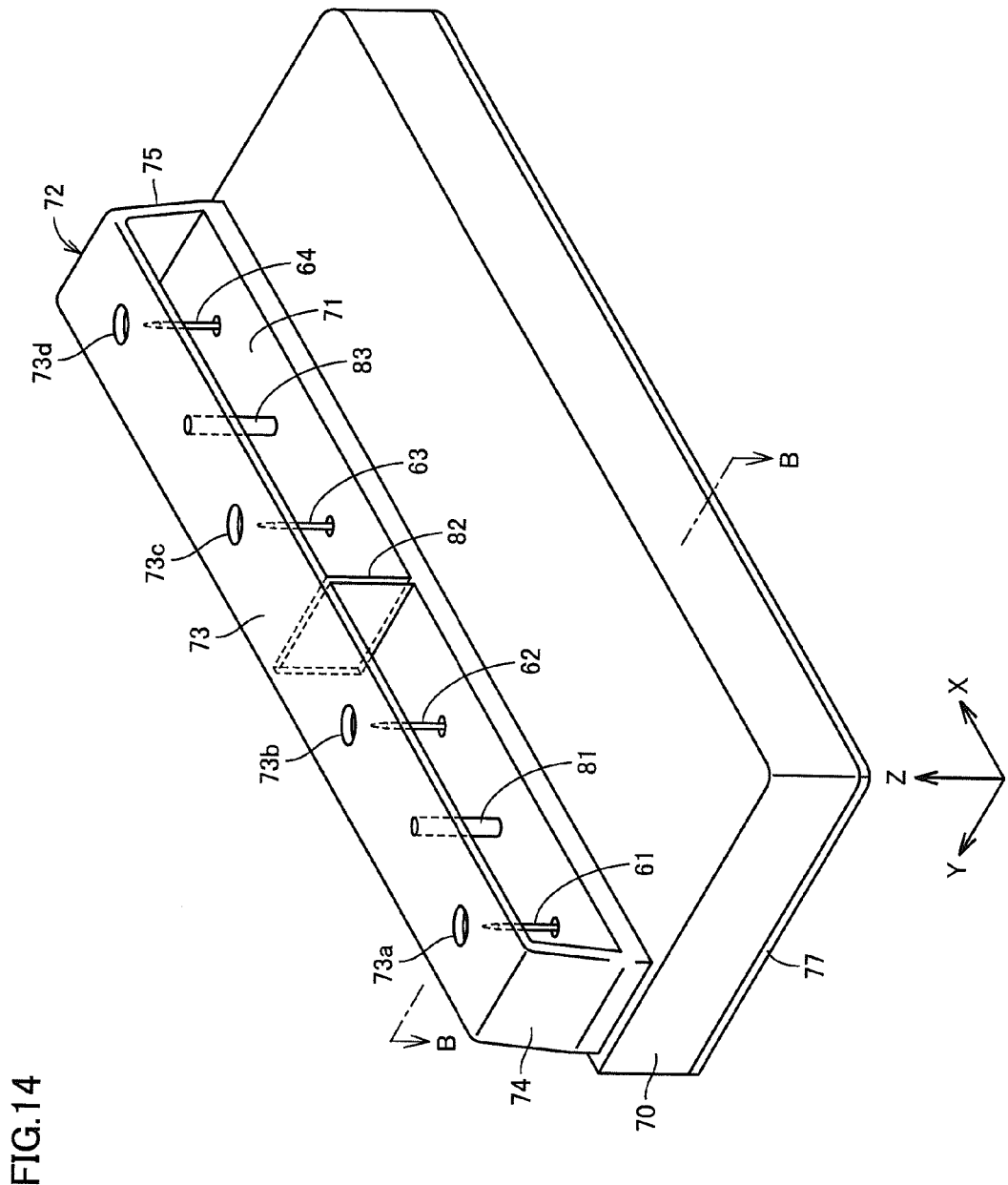
FIG. 14 is a perspective view showing a configuration of an ion generation apparatus in accordance with Embodiment 3 of the present invention.
Figure 15:
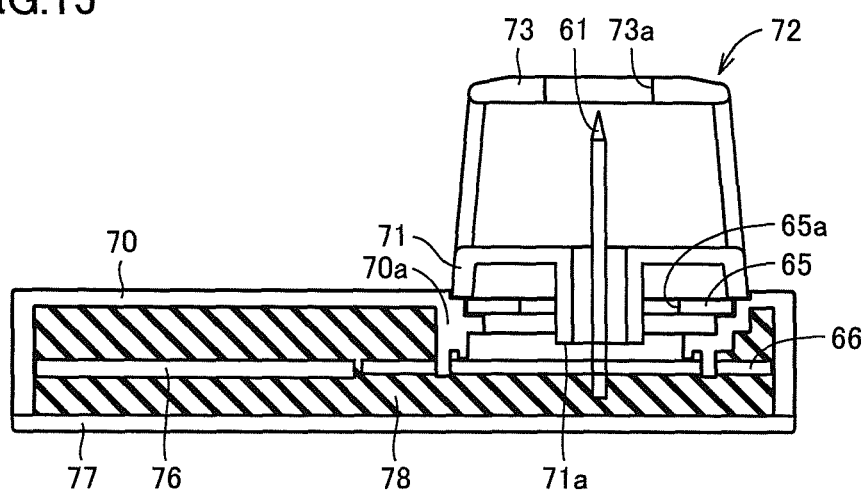
FIG. 15 is a cross sectional view taken along a line B-B in FIG. 14.

FIG. 14 is a perspective view showing a configuration of an ion generation apparatus in accordance with Embodiment 3 of the present invention, and FIG. 15 is a cross sectional view taken along a line B-B in FIG. 14. In FIGS. 14 and 15, the ion generation apparatus includes needle electrodes 61, 63 for generating positive ions, needle electrodes 62, 64 for generating negative ions, four annular induction electrodes (not shown) each for forming an electric field between itself and each of needle electrodes 61 to 64, and two rectangular printed substrates 65, 66.

Printed substrates 65, 66 are arranged parallel to each other in a vertical direction in FIG. 15, with a predetermined interval therebetween. The four induction electrodes are formed on a surface of printed substrate 65 using wiring layers of printed substrate 65, and aligned in the X direction in FIG. 14. A hole 65*a* penetrating through printed substrate 65 is opened on the inside of each induction electrode.

Each of needle electrodes 61 to 64 is provided perpendicular to printed substrates 65, 66. Specifically, each of needle electrodes 61 to 64 has a base end portion inserted in a hole in printed substrate 66, and a tip end portion penetrating through the center of corresponding hole 65*a* in printed substrate 65. The base end portion of each of needle electrodes 61 to 64 is fixed to printed substrate 66 by soldering. The tip end portion of each of needle electrodes 61 to 64 is sharply pointed.

Further, the ion generation apparatus includes a thin rectangular parallelepiped casing 70, a lid member 71 closing an opening in an upper surface of casing 70, a protective cover 72 covering the tip end portions of needle electrodes 61 to 64, a circuit substrate 76, and a bottom plate 77 closing an opening in a lower surface of casing 70. The opening provided in the upper surface of casing 70 is a rectangular opening slightly larger than printed substrate 65. Further, the lower surface of casing 70 is entirely opened.

Casing 70 is formed of an insulating resin. A support portion 70*a* is formed inside the opening in the upper surface of casing 70. Printed substrates 65, 66 are horizontally accommodated above and below support portion 70*a*, respectively. Circuit substrate 76 is horizontally arranged adjacent to printed substrate 66. Circuit substrate 76 and printed substrates 65, 66 are electrically connected by wiring. The opening in the lower surface of casing 70 is closed by bottom plate 77. A resin 78 for insulation is charged in a high-voltage portion within casing 70. Resin 78 is charged up to a lower surface of printed substrate 66.

Lid member 71 is formed of an insulating resin. Lid member 71 is arranged to close the opening in the upper surface of casing 70. Four cylindrical bosses 71*a* are formed in a lower surface of lid member 71 at positions corresponding to four holes 65*a* in printed substrate 65 and four needle electrodes 61 to 64.

Each boss 71*a* has an inner diameter larger than an outer diameter of each of needle electrodes 61 to 64. In addition, each boss 71*a* has an outer diameter smaller than an inner diameter of hole 65*a* in printed substrate 65. Each boss 71*a* penetrates through hole 65*a* in printed substrate 65. A slight gap is formed between tip end surfaces (lower end surfaces) of bosses 71*a* and a surface of printed substrate 66. Each of needle electrodes 61 to 64 penetrates through corresponding boss 71*a*, and the tip end portions of needle electrodes 61 to 64 protrude above lid member 71 by about 7.5 mm.

Protective cover 72 is formed integrally with lid member 71 using an insulating resin. Protective cover 72 includes a top plate 73 and support members 74, 75. Top plate 73 is provided to face an upper surface of lid member 71. Both ends of top plate 73 in the longitudinal direction are fixed to the upper surface of lid member 71 by support members 74, 75, respectively. Holes 73*a* to 73*d* are opened in top plate 73 at positions intersecting with center lines of needle electrodes 61 to 64, respectively. Each of holes 73*a* to 73*d* has an inner diameter of about 6 mm. A lower surface of top plate 73 and tip ends of needle electrodes 61 to 64 are provided in a substantially identical plane or to have a slight gap therebetween.

Specifically, when it is assumed that the direction of the long side of printed substrate 66 is defined as an X direction, the direction of the short side of printed substrate 66 is defined as a Y direction, and the direction perpendicular to the surface of printed substrate 66 is defined as a Z direction, four needle electrodes 61 to 64 are aligned in the X direction with being oriented in the Z direction, and protrude from casing 70 and lid member 71. Further, protective cover 72 is provided with four holes 73*a* to 73*d* opened to allow the tip ends of four needle electrodes 61 to 64 to be seen from the Z direction, respectively, and an opening opened to allow needle electrodes 61 to 64 to be seen from the Y direction.

Further, a rib 81 in the shape of a column is provided at an intermediate position between needle electrodes 61, 62, a rib 82 in the shape of a flat plate is provided at an intermediate position between needle electrodes 62, 63, and a rib 83 in the shape of a column is provided at an intermediate position between needle electrodes 63, 64.

Rib 82 in the shape of a flat plate is arranged parallel to a YZ plane, and connected between lid member 71 and top plate 73. A space between lid member 71 and top plate 73 is divided by rib 82 into two. Since rib 82 is arranged parallel to a YZ plane, when rib 82 is arranged inside duct 41 as shown in FIG. 6, rib 82 allows the wind inside duct 41 to flow smoothly. Each of ribs 81, 83 in the shape of a column extends in the Z direction, and is connected between lid member 71 and top plate 73.

Other than those, the configuration and the operation of this ion generation apparatus are identical to those of the ion generation apparatuses in Embodiments 1, 2, and thus the description thereof will not be repeated. Also with this ion generation apparatus, the same effect as those in Embodiments 1, 2 can be obtained.

[Embodiment 4]

Figure 16:
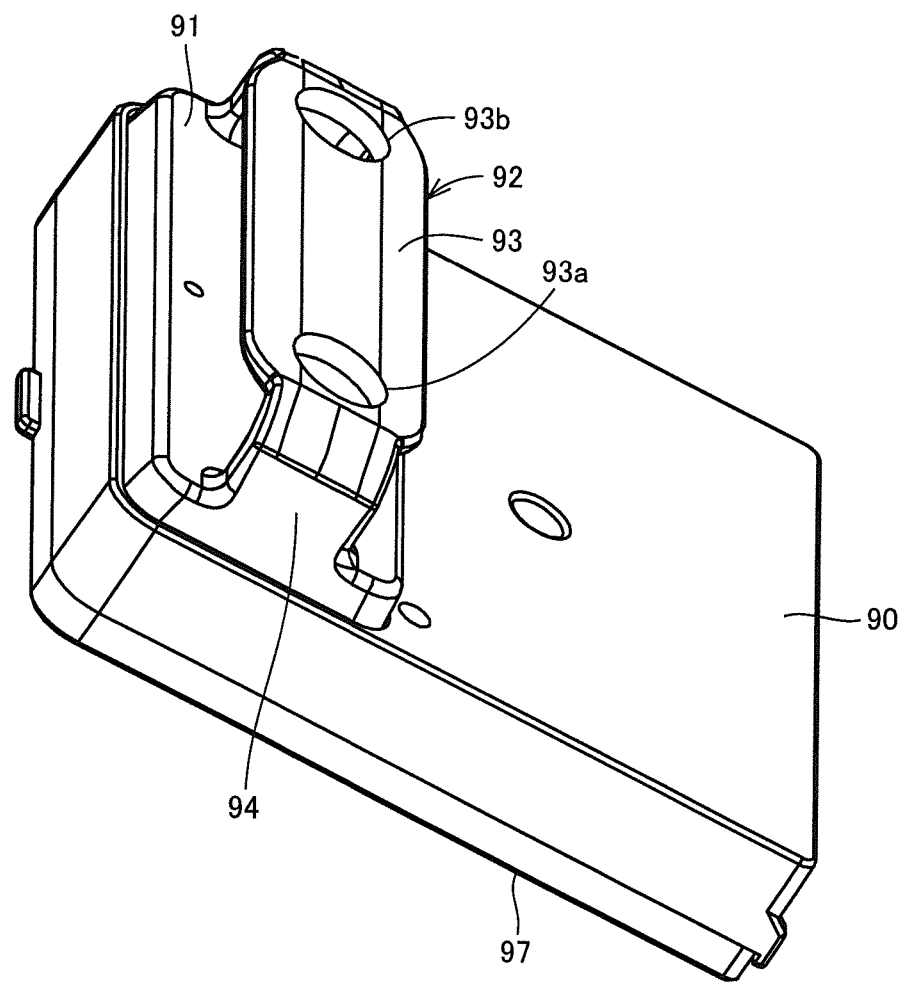
FIG. 16 is a perspective view showing a configuration of an ion generation apparatus in accordance with Embodiment 4 of the present invention.
Figure 17:
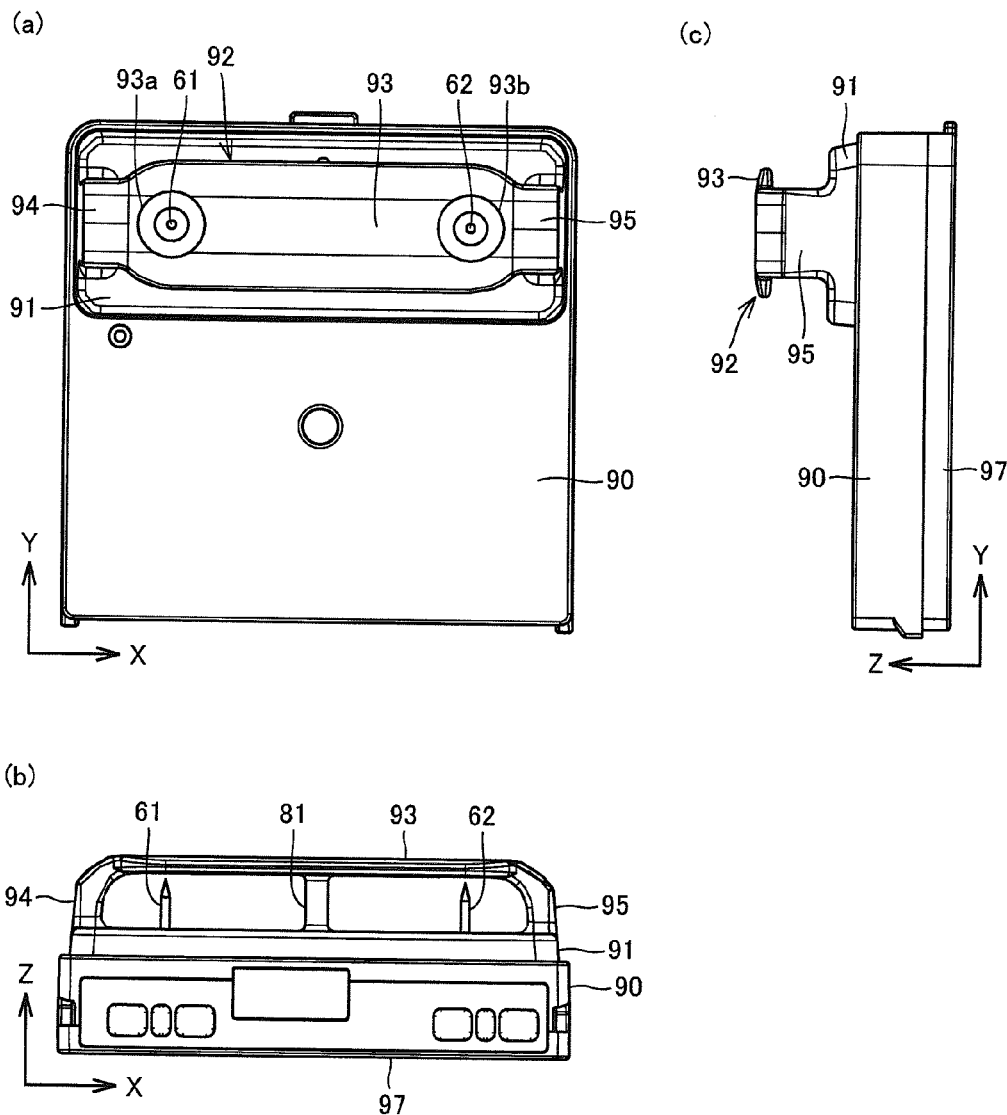
FIG. 17 shows the configuration of the ion generation apparatus shown in FIG. 16.

FIG. 16 is a perspective view showing a configuration of an ion generation apparatus in accordance with Embodiment 4 of the present invention, which is compared with FIG. 14. In addition, FIG. 17(*a*) is a plan view of the ion generation apparatus shown in FIG. 16, FIG. 17(*b*) is a front view thereof, and FIG. 17(*c*) is a side view thereof. In FIGS. 16 and 17(*a*) to 17(*c*), the ion generation apparatus includes needle electrode 61 for generating positive ions, needle electrode 62 for generating negative ions, and two annular induction electrodes (not shown) each for forming an electric field between itself and each of needle electrodes 61, 62. Two needle electrodes 61, 62 are aligned in the X direction with being oriented in the Z direction.

Further, the ion generation apparatus includes a thin rectangular parallelepiped casing 90, a lid member 91 closing an opening in an upper surface of casing 90, a protective cover 92 covering the tip end portions of needle electrodes 61, 62, and a bottom plate 97 closing an opening in a lower surface of casing 90. Casing 90 is formed of an insulating resin. Casing 90 accommodates a printed substrate having two needle electrodes 61, 62 mounted thereon, a printed substrate having the two induction electrodes mounted thereon, a circuit substrate, and the like.

Lid member 91 is formed of an insulating resin. Lid member 91 is arranged to close the opening in the upper surface of casing 90. Two cylindrical bosses (not shown) are formed in a lower surface of lid member 91 at positions corresponding to two needle electrodes 61, 62. Each of needle electrodes 61, 62 penetrates through the corresponding boss, and the tip end portions of needle electrodes 61, 62 protrude above lid member 91 by about 7.5 mm.

Protective cover 92 is formed integrally with lid member 91 using an insulating resin. Protective cover 92 includes a top plate 93 and support members 94, 95. Top plate 93 is provided to face an upper surface of lid member 91. Both ends of top plate 93 in the longitudinal direction are fixed to the upper surface of lid member 91 by support members 94, 95, respectively. As viewed from the Z direction (i.e., from above), both end portions of top plate 93 in a length direction have a width smaller than that of a central portion thereof. Further, as viewed from the X direction, each of support members 94, 95 has a width smaller than that of top plate 93. Furthermore, as viewed from the X direction, each of support members 94, 95 supports a central portion of top plate 93. By narrowing the width of support members 94, 95 to be smaller than the width of top plate 93 as described above, ions generated at needle electrodes 61, 62 can be readily diffused in the X direction, and an ion concentration can be detected accurately without disturbing supply of ions, which will be described later.

Further, holes 93a, 93b are opened in top plate 93 at positions intersecting with center lines of needle electrodes 61, 62, respectively. Each of holes 93a, 93b has an inner diameter of about 6 mm. A lower surface of top plate 93 and the tip ends of needle electrodes 61, 62 are provided in a substantially identical plane or to have a slight gap therebetween.

Specifically, when it is assumed that the direction of the long side of top plate 93 is defined as an X direction, the direction of the short side of top plate 93 is defined as a Y direction, and the direction perpendicular to the surface of top plate 93 is defined as a Z direction, two needle electrodes 61, 62 are aligned in the X direction with being oriented in the Z direction, and protrude from casing 90 and lid member 91. Further, protective cover 92 is provided with two holes 93a, 93b opened to allow the tip ends of two needle electrodes 61, 62 to be seen from the Z direction, respectively, and an opening opened to allow needle electrodes 61, 62 to be seen from the Y direction.

Further, rib 81 in the shape of a column is provided at an intermediate position between needle electrodes 61, 62. Rib 81 in the shape of a column extends in the Z direction, and is connected between lid member 91 and top plate 93. Rib 82 in the shape of a flat plate may be provided instead of rib 81 in the shape of a column. Other than those, the configuration and the operation of this ion generation apparatus are identical to those of the ion generation apparatus in Embodiment 3, and thus the description thereof will not be repeated.

Figure 18:
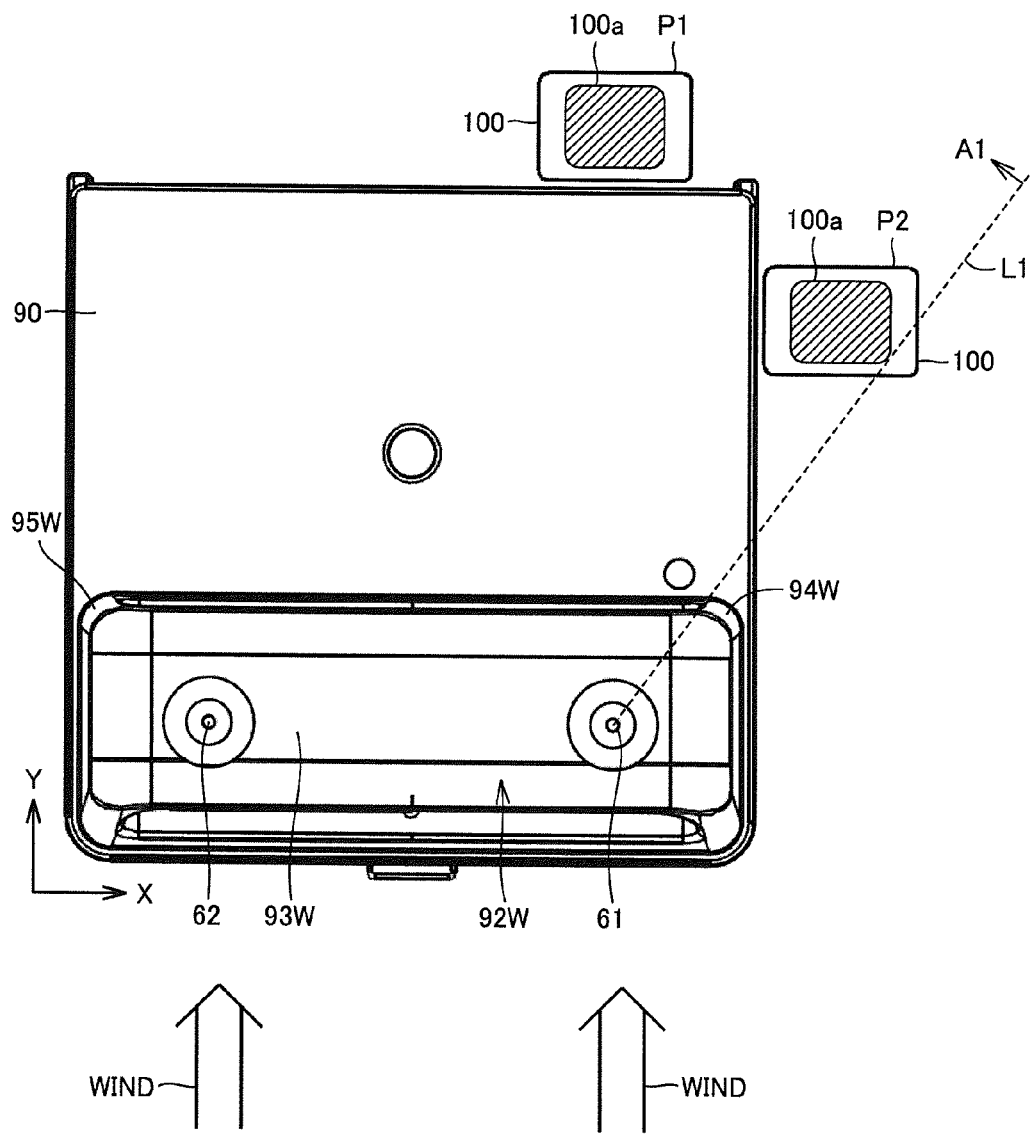
FIG. 18 is a view for illustrating the effect of Embodiment 4.

Next, the effect of this ion generation apparatus will be described. It is assumed that, as shown in FIG. 18, a top plate 93W having a constant width, and support members 94W, 95W having a width as viewed from the X direction identical to the width of top plate 93W are used, and the air is blown in the Y direction from the side of needle electrodes 61, 62. It is also assumed that an ion sensor 100 can be arranged along the outer periphery of casing 90, and positive ions are detected using ion sensor 100. In this case, since positive ions are diffused in a highly concentrated state within an area A1 inside a straight line L1 connecting needle electrode 61 and an end of an opening in a protective cover 92W (an end of support member 94W), it is necessary to arrange ion sensor 100 at a position which is outside the outer periphery of casing 90 and within area A1.

Further, the ion concentration can be detected accurately when ion sensor 100 is provided at a position having a high ion concentration, when compared with a case where ion sensor 100 is provided at a position having a low ion concentration. However, when ion sensor 100 is arranged at a position P1 which is directly on the leeward side of needle electrode 61 in the Y direction, the ion concentration is increased, but the amount of ions captured by an electrode 100a of ion sensor 100 is increased, causing a reduction in the amount of supplied ions.

Accordingly, it is preferable to arrange ion sensor 100 at a position P2 which is not on the leeward side of needle electrode 61 in the Y direction and is closest to needle electrode 61. However, when protective cover 92W in FIG. 18 is used, an angle between straight line L1 and an X axis is increased and area A1 is decreased, and thus the distance between needle electrode 61 and ion sensor 100 cannot be reduced so much.

Figure 19:
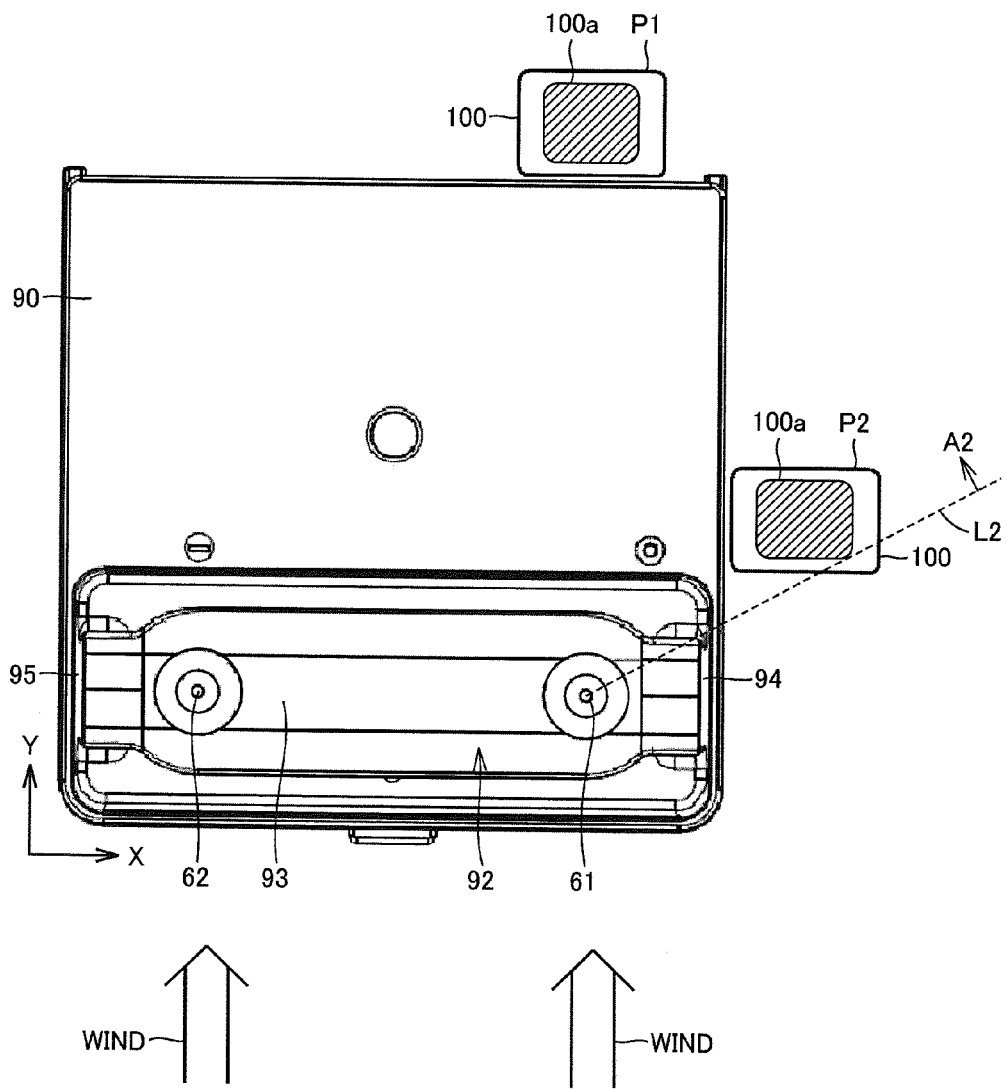
FIG. 19 is another view for illustrating the effect of Embodiment 4.

In contrast, in Embodiment 4, since support members 94, 95 are formed to have a width as viewed from the X direction smaller than the width of top plate 93W as shown in FIG. 19, an angle between a straight line L2 connecting needle electrode 61 and an end of the opening in protective cover 92 (an end of support member 94) and the X axis is decreased, and an area A2 in which positive ions are diffused is increased. Accordingly, the distance between needle electrode 61 and ion sensor 100 can be fully reduced, and the ion concentration can be detected accurately without causing a reduction in the amount of supplied ions.

Figure 20:
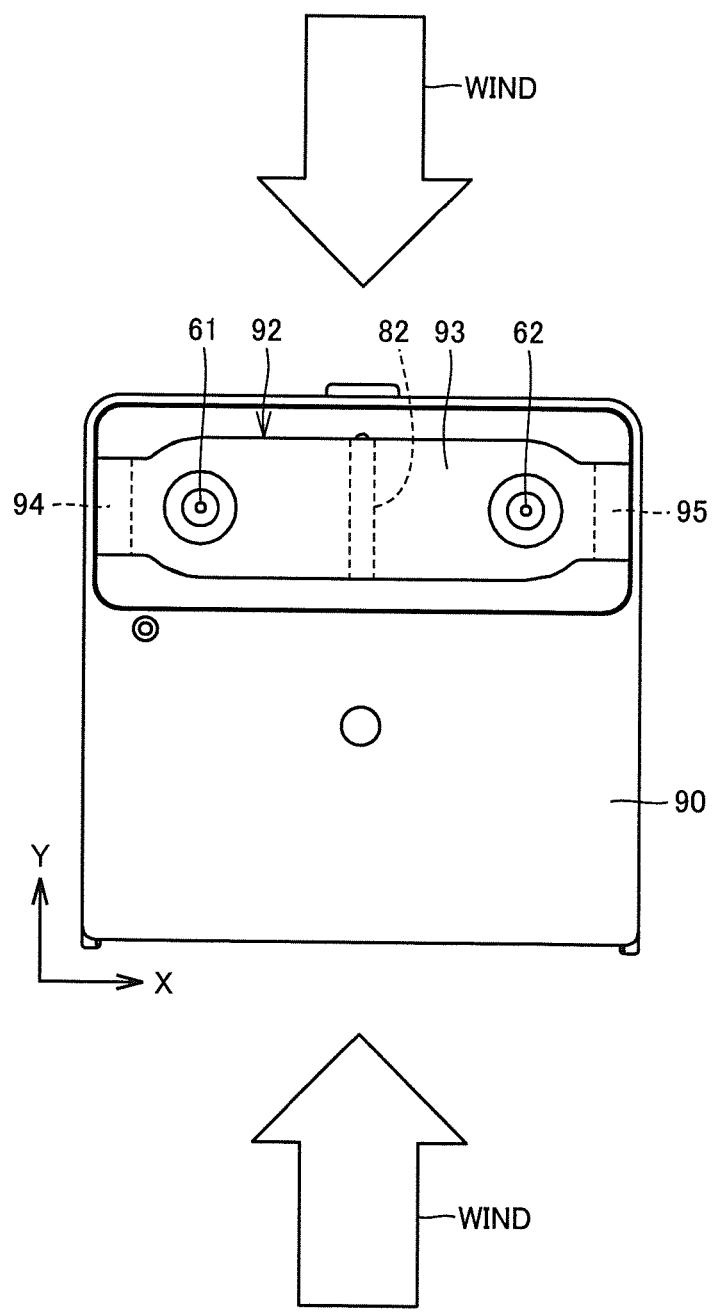
FIG. 20 is still another view for illustrating the effect of Embodiment 4.

It is noted that, in Embodiment 4, as viewed from the X direction, each of support members 94, 95 has a width smaller than that of top plate 93, and support members 94, 95 support the central portion of top plate 93, as shown in FIG. 20. In other words, as viewed from the Z direction, upper and lower portions of the both end portions of top plate 93 are cut out and the both end portions are formed to be narrower than the central portion of top plate 93, and the both end portions formed to be narrower are supported by support members 94, 95. Accordingly, ions can be diffused widely in both of a case where the air is blown in a direction from top to bottom in FIG. 20 and a case where the air is blown in a direction from bottom to top in FIG. 20.

Figure 21:
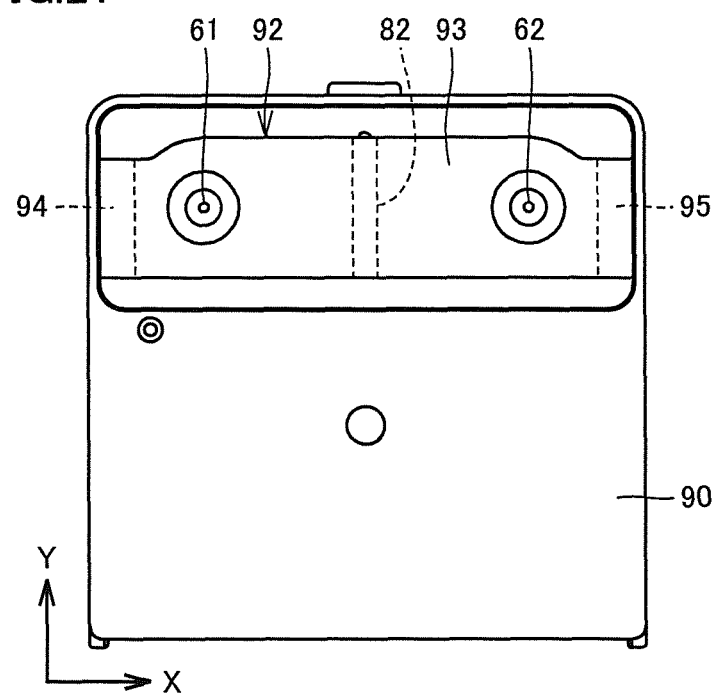
FIG. 21 is a view showing a modification of Embodiment 4.

Further, when the direction in which the air is blown has been determined, only corners of top plate 93 and support members 94, 95 on the leeward side may be cut out, as shown in FIG. 21. In other words, as viewed from the X direction, support members 94, 95 are formed to have a width smaller than that of top plate 93, and support members 94, 95 support an end portion of top plate 93 on the windward side. Also in this modification, the same effect as that in Embodiment 4 can be obtained.

COMPARATIVE EXAMPLE 1

Figure 22:
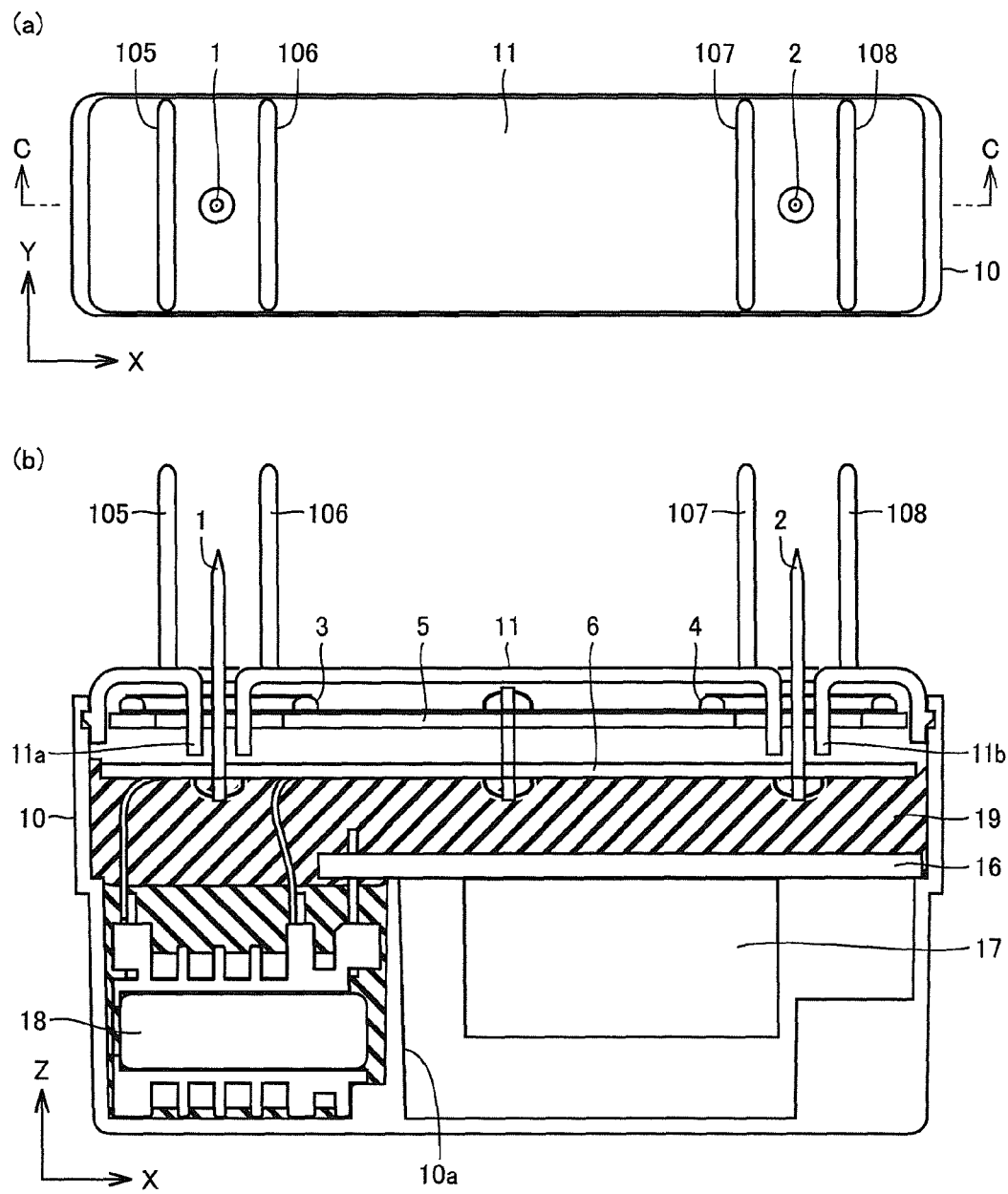
FIG. 22 is a view showing Comparative Example 1 of Embodiment 1.

FIG. 22(*a*) is a top view of an ion generation apparatus in accordance with Comparative Example 1 of Embodiment 1 described above, and FIG. 22(*b*) is a cross sectional view taken along a line C-C in FIG. 22(*a*). Referring to FIGS. 22(*a*) and 22(*b*), the ion generation apparatus is different from the ion generation apparatus in FIGS. 1(*a*) and 1(*b*) in that protective cover 12 is replaced with four ribs 105 to 108 in the shape of a flat plate.

Each of ribs 105 to 108 is provided on a surface of lid member 11, and arranged parallel to the YZ plane. Ribs 105, 106 are provided to sandwich the tip end portion of needle electrode 1 therebetween, and ribs 107, 108 are provided to sandwich the tip end portion of needle electrode 2 therebetween. In the ion generation apparatus, since ribs 105 to 108 are provided, the user can be prevented from touching the tip end portion of needle electrode 1, 2 and injuring his or her finger.

In such an ion generation apparatus, if a gap between ribs 105, 106 (107, 108) is widened too much, a finger may enter between ribs 105, 106 (107, 108) and be injured by the tip end of needle electrode 1 (2). Accordingly, it is necessary to set the gap between ribs 105, 106 (107, 108) to be narrow to prevent entrance of a finger. However, if the gap is too narrow, the distance between rib 105, 106 (107, 108) and needle electrode 1 (2) becomes too close, and the electric fields each generated between needle electrode 1, 2 and induction electrode 3, 4 are disturbed by ribs 105 to 108, causing a reduction in the amount of generated ions. The amount of generated ions is also reduced when ribs 105 to 108 are charged. Further, ribs 105, 106 (107, 108) provided with a narrow interval therebetween offer resistance to the wind, and thus the wind speed on the periphery of needle electrodes 1, 2 is reduced, which also contributes to a reduction in the amount of generated ions.

In contrast, in the invention of the present application, the distance between support member 14, 15, 74, 75 supporting top plate 13, 73 of protective cover 12, 72 and needle electrode 1, 2, 61 to 64 can be easily ensured, and disturbance of the electric fields by protective cover 12, 72 and a reduction in wind speed do not occur. Therefore, the user can be prevented from being injured, and ions can be generated efficiently.

COMPARATIVE EXAMPLE 2

Figure 23:
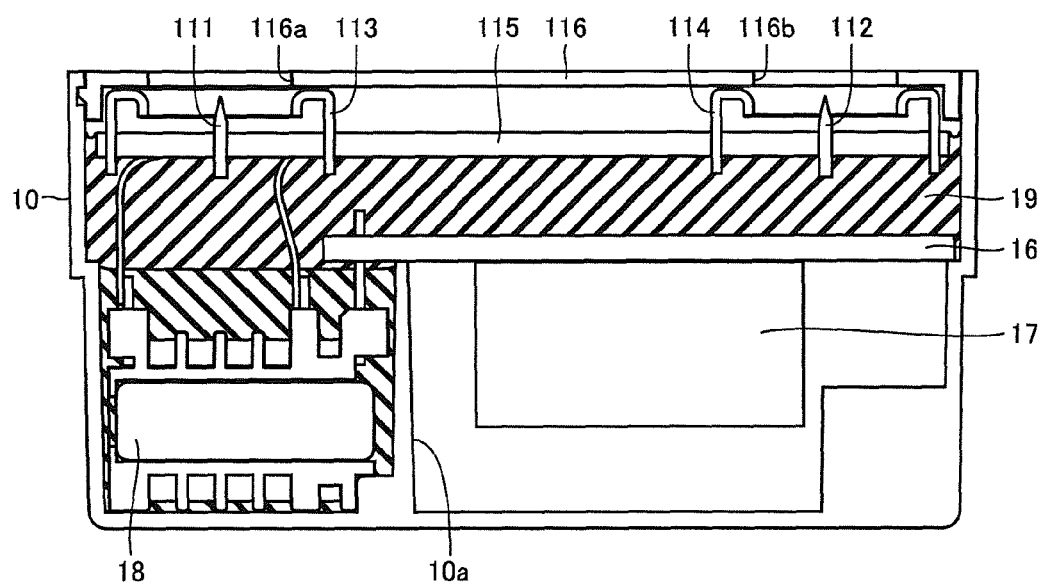
FIG. 23 is a view showing Comparative Example 2 of Embodiment 1.

FIG. 23 is a cross sectional view of an ion generation apparatus in accordance with Comparative Example 2 of Embodiment 1 described above. In FIG. 23, the ion generation apparatus includes a needle electrode 111 for generating positive ions, a needle electrode 112 for generating negative ions, an annular induction electrode 113 for forming an electric field between itself and needle electrode 111, an annular induction electrode 114 for forming an electric field between itself and needle electrode 112, a rectangular printed substrate 115, and a flat plate-like lid member 116.

Induction electrode 113 is annularly formed of a metal plate, and is mounted at one end portion of a surface of printed substrate 115. Needle electrode 111 has a base end portion inserted in a hole at one end portion of printed substrate 115, and a tip end portion arranged at a central portion of induction electrode 113. Induction electrode 114 is annularly formed of a metal plate, and is mounted at the other end portion of the surface of printed substrate 115. Needle electrode 112 has a base end portion inserted in a hole at the other end portion of printed substrate 115, and a tip end portion arranged at a central portion of induction electrode 114.

Printed substrate 115 is accommodated in an upper portion of casing 10. An opening in casing 10 is closed by lid member 116. Holes 116*a*, 116*b* are opened in lid member 116 at positions facing needle electrodes 111, 112, respectively. Tip ends of needle electrodes 111, 112 are accommodated within casing 10. Ions generated at needle electrodes 111, 112 are supplied to the outside via holes 116*a*, 116*b* in lid member 116.

In the ion generation apparatus, since needle electrodes 111, 112 are accommodated within casing 10, the user can be prevented from touching the tip end of needle electrode 111, 112 and injuring his or her finger. However, in the ion generation apparatus, since the tip end portions of needle electrodes 111, 112 do not protrude out of casing 10, when the ion generation apparatus is placed inside duct 41, ions generated at the tip end portions of needle electrodes 111, 112 cannot be emitted efficiently to the outside on the wind inside duct 41.

Further, since needle electrodes 111, 112 and induction electrodes 113, 114 are mounted on one printed substrate 115, when the ion generation apparatus is placed in a high-humidity environment with dust accumulating on the surface of printed substrate 115, a current may leak between needle electrode 111, 112 and induction electrode 113, 114 via the moistened dust, causing a reduction in the amount of generated ions.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1, 2, 61 to 64, 111, 112: needle electrode; 3, 4, 113, 114: induction electrode; 5, 6, 65, 66, 115: printed substrate; 5*a*, 5*b*, 13*a*, 13*b*, 65*a*, 73*a* to 73*d*, 93*a*, 93*b*, 116*a*, 116*b*: hole; 10, 70, 90: casing; 11, 71, 91, 116: lid member; 11*a*, 11*b*, 71*a*: boss; 12, 72, 92: protective cover; 13, 73, 93: top plate; 13*c*, 13*d*: cutout portion; 14, 15, 74, 75, 94, 95: support member; 14*a*, 15*a*: opening; 16, 76: circuit substrate; 17: circuit component; 18: transformer; 19: resin; T1: power supply terminal; T2: ground terminal; 20, 24, 28, 32, 33: diode; 21 to 23, 25: resistance element; 26: NPN bipolar transistor; 27, 31: boost transformer; 27*a*, 31*a*: primary winding; 27*b*: base winding; 27*c*, 31*b*: secondary winding; 29: capacitor; 30: diode thyristor; 40: main body; 40*a*: inlet; 40*b*, 40*c*: outlet; 40*d*: back lid; 41, 52, 54: duct; 42: cross flow fan; 43: ion generation apparatus; 44: grill; 45: filter; 46: fan guard; 50, 51, 105 to 108: rib; 77, 97: bottom plate.

The invention claimed is:

1. An ion generation apparatus generating ions including a plurality of needle electrodes, comprising:
   a substrate having said plurality of needle electrodes mounted thereon;
   a casing accommodating said substrate, said plurality of needle electrodes having tip end portions aligned in an X direction and being oriented in a Z direction, and protruding from said casing; and
   a protective cover covering the tip end portions of said plurality of needle electrodes,
   said protective cover being provided with a plurality of first holes opened to allow tip ends of said plurality of needle electrodes to be seen from the Z direction, respectively, and a first opening opened to allow said plurality of needle electrodes to be seen from a Y direction;
   said protective cover includes
      a top plate provided to face a lid member of the casing and having said plurality of first holes opened therein, and
      support members provided between said top plate and said lid member and having said first opening opened therein.

2. The ion generation apparatus according to claim 1, further comprising a lid member closing said casing so as to cover said substrate, wherein
   said lid member is provided with a second hole opened at a position corresponding to each needle electrode, and the tip end portion of each needle electrode penetrates through the corresponding second hole and is arranged between said lid member and said top plate.

3. The ion generation apparatus according to claim 2, wherein said support members support said top plate on both sides of said plurality of needle electrodes as viewed from the Y direction.

4. The ion generation apparatus according to claim 2, wherein, as viewed from the X direction, said support members have a width smaller than that of said top plate.

5. The ion generation apparatus according to claim 4, wherein, as viewed from the X direction, said support members support a central portion of said top plate.

6. The ion generation apparatus according to claim 4, wherein, as viewed from the X direction, said support members support one end portion of said top plate.

7. The ion generation apparatus according to claim 2, further comprising a rib provided between each two adjacent needle electrodes and connected between said top plate and said lid member.

8. The ion generation apparatus according to claim 7, wherein said rib is formed in a shape of a flat plate, and provided parallel to a YZ plane.

9. The ion generation apparatus according to claim 7, wherein said rib is formed in a shape of a column, and extends in the Z direction.

10. The ion generation apparatus according to claim 1, wherein each two adjacent needle electrodes generate ions having polarities different from each other.

11. Electric equipment, comprising:
the ion generation apparatus according to claim 1; and
a duct blowing air in a predetermined direction,
said plurality of needle electrodes of said ion generation apparatus being provided inside said duct.

12. The electric equipment according to claim 11, wherein said predetermined direction intersects with the X direction.

13. The electric equipment according to claim 11, wherein said predetermined direction obliquely intersects with the X direction.

14. The electric equipment according to claim 11, wherein said predetermined direction is identical to the X direction.

15. An ion generation apparatus generating ions including a plurality of needle electrodes, comprising:
a substrate having said plurality of needle electrodes mounted thereon;
a casing accommodating said substrate, said plurality of needle electrodes shaving tip end portions aligned in an X direction and being oriented in a Z direction, and protruding from said casing; and
a protective cover covering the tip end portions of said plurality of needle electrodes, said protective cover being provided with a plurality of first holes opened to allow tip ends of said plurality of needle electrodes to be seen from the Z direction, respectively, and a first opening opened to allow said plurality of needle electrodes to be seen from a Y direction
said protective cover includes
a top plate provided to face a lid member of the casing and having said plurality of first holes opened therein, and
support members provided between said top plate and said lid member and having said first opening and a second opening opened therein,
wherein said protective cover is further provided with said second opening opened to allow at least one of said plurality of needle electrodes to be seen from the X direction.

16. The ion generation apparatus according to claim 15, further comprising a lid member closing said casing so as to cover said substrate, wherein
said lid member is provided with a second hole opened at a position corresponding to each needle electrode, and
the tip end portion of each needle electrode penetrates through the corresponding second hole and is arranged between said lid member and said top plate.

17. The ion generation apparatus according to claim 16, wherein said support members support said top plate on both sides of said plurality of needle electrodes as viewed from the Y direction, and support said top plate on both sides of said plurality of needle electrodes as viewed from the X direction.

* * * * *